United States Patent
Horiuchi et al.

(10) Patent No.: US 10,319,533 B2
(45) Date of Patent: Jun. 11, 2019

(54) PHOTOELECTRIC CONVERSION ELEMENT AND SOLAR CELL

(71) Applicants: Tamotsu Horiuchi, Shizuoka (JP); Yuuji Tanaka, Shizuoka (JP); Tsuyoshi Matsuyama, Kanagawa (JP); Takahiro Ide, Shizuoka (JP); Tokushige Kino, Shizuoka (JP); Shigeyo Suzuki, Shizuoka (JP); Naomichi Kanei, Shizuoka (JP)

(72) Inventors: Tamotsu Horiuchi, Shizuoka (JP); Yuuji Tanaka, Shizuoka (JP); Tsuyoshi Matsuyama, Kanagawa (JP); Takahiro Ide, Shizuoka (JP); Tokushige Kino, Shizuoka (JP); Shigeyo Suzuki, Shizuoka (JP); Naomichi Kanei, Shizuoka (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 15/866,536

(22) Filed: Jan. 10, 2018

(65) Prior Publication Data
US 2018/0197688 A1    Jul. 12, 2018

(30) Foreign Application Priority Data

Jan. 12, 2017   (JP) ................................ 2017-003434
Dec. 15, 2017   (JP) ................................ 2017-240882

(51) Int. Cl.
*H01L 31/00*     (2006.01)
*H01G 9/20*      (2006.01)
(Continued)

(52) U.S. Cl.
CPC ......... *H01G 9/2018* (2013.01); *H01G 9/2059* (2013.01); *H01L 51/006* (2013.01);
(Continued)

(58) Field of Classification Search
CPC .. H01G 9/2018; H01G 9/2059; H01L 51/006; H01L 51/0052; H01L 51/0067;
(Continued)

(56) References Cited

U.S. PATENT DOCUMENTS

2015/0279573 A1   10/2015   Horiuchi et al.
2016/0126021 A1   5/2016    Tanaka et al.
(Continued)

FOREIGN PATENT DOCUMENTS

JP    1-220380      9/1989
JP    11-086916     3/1999
(Continued)

OTHER PUBLICATIONS

English machine translation of JP 2016/216663 A. (Year: 2019).*

*Primary Examiner* — Angelo Trivisonno
(74) *Attorney, Agent, or Firm* — Oblon, McClelland, Maier & Neustadt, L.L.P.

(57) ABSTRACT

A photoelectric conversion element including a first electrode, an electron transport layer on the first electrode, a charge transfer layer, and a second electrode is provided. The electron transport layer includes an electron transport compound, and the electron transport compound carries a compound represented by the following formula (1) and a compound represented by the following formula (2):

(Continued)

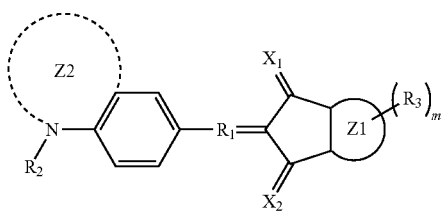

Formula (1)

where each of $X_1$ and $X_2$ independently represents oxygen atom, sulfur atom, or selenium atom; $R_1$ represents methine group; $R_2$ represents an alkyl group, an aryl group, or a heterocyclic group; each of $R_3$ independently represents an acidic group; m represents an integer of 1 or 2; and each of $Z_1$ and $Z_2$ independently represents a group forming a cyclic structure;

$$R_5-R_4-COOH \qquad \text{Formula (2)}$$

where $R_4$ represents an aryl group or a heterocyclic group; and $R_5$ represents an alkyl group, an alkoxy group, an alkenyl group, an alkylthio group, or an aryl ether group.

9 Claims, 4 Drawing Sheets

(51) Int. Cl.
*H01L 51/42* (2006.01)
*H01L 51/44* (2006.01)
*H01L 51/00* (2006.01)

(52) U.S. Cl.
CPC ...... *H01L 51/0052* (2013.01); *H01L 51/0065* (2013.01); *H01L 51/0067* (2013.01); *H01L 51/0068* (2013.01); *H01L 51/0072* (2013.01); *H01L 51/0074* (2013.01); *H01L 51/4273* (2013.01); *H01L 51/442* (2013.01); *H01L 51/4226* (2013.01); *H01L 2251/303* (2013.01); *Y02E 10/549* (2013.01)

(58) Field of Classification Search
CPC ............ H01L 51/4273; H01L 51/0074; H01L 51/0068; H01L 51/0072; H01L 51/0065
See application file for complete search history.

(56) References Cited

U.S. PATENT DOCUMENTS

| | | |
|---|---|---|
| 2016/0276609 A1 | 9/2016 | Horiuchi et al. |
| 2017/0069431 A1 | 3/2017 | Tanaka et al. |
| 2017/0092433 A1 | 3/2017 | Kanei et al. |
| 2017/0222150 A1 | 8/2017 | Arai et al. |
| 2017/0243698 A1 | 8/2017 | Kanei et al. |
| 2017/0358399 A1 | 12/2017 | Matsuyama et al. |

FOREIGN PATENT DOCUMENTS

| | | |
|---|---|---|
| JP | 11-144773 | 5/1999 |
| JP | 11-238905 | 8/1999 |
| JP | 2000-106223 | 4/2000 |
| JP | 2016216663 A | * 12/2016 |

\* cited by examiner

PHOTOELECTRIC CONVERSION ELEMENT AND SOLAR CELL

CROSS-REFERENCE TO RELATED APPLICATIONS

This patent application is based on and claims priority pursuant to 35 U.S.C. § 119(a) to Japanese Patent Application Nos. 2017-003434 and 2017-240882, filed on Jan. 12, 2017 and Dec. 15, 2017, respectively, in the Japan Patent Office, the entire disclosure of each of which is hereby incorporated by reference herein.

BACKGROUND

Technical Field

The present disclosure relates to a photoelectric conversion element and a solar cell.

Description of the Related Art

In recent years, the importance of solar cells as an alternative energy for fossil fuels and as a measure against global warming is increasing. However, current solar cells, as typified by silicon-based solar cells, are expensive at present and become a factor impeding the spread.

In view of this situation, various low-cost solar cells are now actively being researched and developed. For example, a solar cell using a sensitizing dye has been proposed.

SUMMARY

In accordance with some embodiments of the present invention, a photoelectric conversion element is provided. The photoelectric conversion element includes a first electrode, an electron transport layer on the first electrode, a charge transfer layer, and a second electrode. The electron transport layer includes an electron transport compound, and the electron transport compound carries a compound represented by the following formula (1) and a compound represented by the following formula (2):

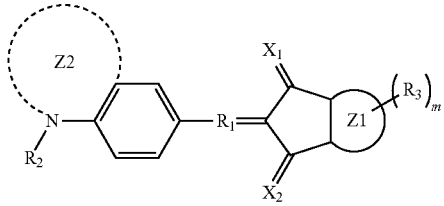

Formula (1)

where each of $X_1$ and $X_2$ independently represents oxygen atom, sulfur atom, or selenium atom; $R_1$ represents methine group; $R_2$ represents an alkyl group, an aryl group, or a heterocyclic group; each of $R_3$ independently represents an acidic group; m represents an integer of 1 or 2; and each of $Z_1$ and $Z_2$ independently represents a group forming a cyclic structure;

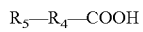 Formula (2)

where $R_4$ represents an aryl group or a heterocyclic group; and $R_5$ represents an alkyl group, an alkoxy group, an alkenyl group, an alkylthio group, or an aryl ether group.

In accordance with some embodiments of the present invention, a solar cell including the above photoelectric conversion element is provided.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

Figure 1:
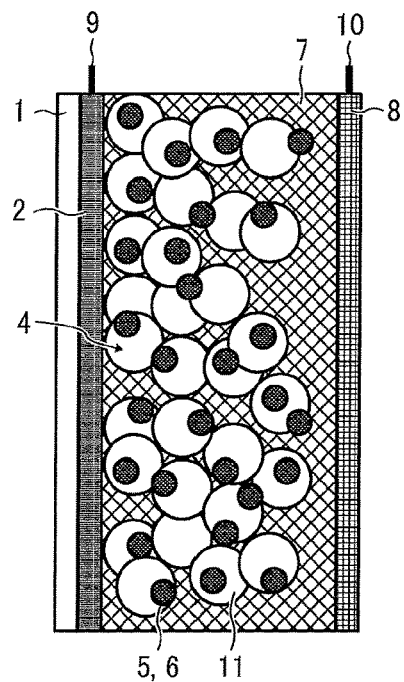
FIG. 1 is a cross-sectional view of a photoelectric conversion element in accordance with some embodiments of the present invention.

The accompanying drawings are intended to depict example embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments of the present invention are described in detail below with reference to accompanying drawings. In describing embodiments illustrated in the drawings, specific terminology is employed for the sake of clarity. However, the disclosure of this patent specification is not intended to be limited to the specific terminology so selected, and it is to be understood that each specific element includes all technical equivalents that have a similar function, operate in a similar manner, and achieve a similar result.

For the sake of simplicity, the same reference number will be given to identical constituent elements such as parts and materials having the same functions and redundant descriptions thereof omitted unless otherwise stated.

In a solar cell, a sensitizing dye is generally adsorbed to a metal oxide semiconductor (such as titanium oxide).

Depending on the type of sensitizing dye, it is known that a strong interaction between sensitizing dye molecules may appear on the titanium oxide to which the sensitizing dye is adsorbed, resulting in deterioration of conversion efficiency. In one proposed approach for solving this problem, the sensitizing dye is dissolved in a solvent along with a co-adsorbent, so as to allow the co-adsorbent to be present between sensitizing dye molecules and reduce the interaction between sensitizing dye molecules. As the co-adsorbent, a cholic acid derivative having a steroid backbone and an alkylphosphonic acid are known.

In the cholic acid derivative, carboxylic acid is bound to an alkyl group. This carboxylic acid has a different acidity from the carboxylic acid in the sensitizing dye. The alkylphosphonic acid also has a different acidity from the sensitizing dye. When the acidity is different, the adsorption speed to titanium oxide is also different. Therefore, after the solution of the dye is used for several times, the ratio between the dye and the co-adsorbent will be significantly changed. For example, when a sensitizing dye based on carboxylic acid and a co-adsorbent based on phosphonic acid are used in combination, the co-adsorbent based on phosphonic acid is drastically decreased. After several times of use, the solution will become sensitizing-dye-rich solution with high interaction of sensitizing dye molecules, resulting in an element having poor property.

To overcome such a drawback, it may be possible to manage the dye solution by measuring the concentrations of the sensitizing dye and the co-adsorbent, after adsorption of the dye, and supplying insufficient components.

However, since conventional co-adsorbents, such as cholic acid derivatives and alkylphosphonic acids, have no absorption at a wavelength of 254 nm, it is difficult to quantify them by a simple means such as high-performance liquid chromatography (HPLC).

Thus, it may be possible to use two types of sensitizing dyes. In this case, a sensitizing dye having an absorption at a wavelength of 254 nm can be used as a co-adsorbent. The dye solution thereof can be managed by HPLC.

In accordance with some embodiments of the present invention, a photoelectric conversion element having high conversion efficiency and long-term stability is provided.

The photoelectric conversion element and solar cell in accordance with some embodiments of the present invention are described below with reference to the drawings.

The photoelectric conversion element in accordance with some embodiments of the present invention includes a first electrode, an electron transport layer on the first electrode, a charge transfer layer, and a second electrode. The electron transport layer contains an electron transport compound carrying a compound represented by the following formula (1) and a compound represented by the following formula (2).

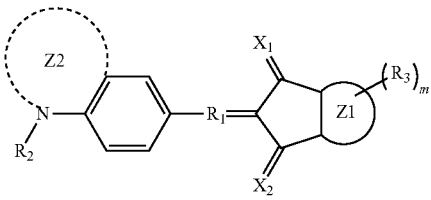

Formula (1)

In the formula (1), each of $X_1$ and $X_2$ independently represents oxygen atom, sulfur atom, or selenium atom; $R_1$ represents methine group; $R_2$ represents an alkyl group, an aryl group, or a heterocyclic group; each of $R_3$ independently represents an acidic group; m represents an integer of 1 or 2; and each of $Z_1$ and $Z_2$ independently represents a group forming a cyclic structure.

$$R_5—R_4—COOH \qquad \text{Formula (2)}$$

In the formula (2), $R_4$ represents an aryl group or a heterocyclic group; and $R_5$ represents an alkyl group, an alkoxy group, an alkenyl group, an alkylthio group, or an aryl ether group.

FIG. 1 is a cross-sectional view of a photoelectric conversion element according to an embodiment of the present invention.

Referring to FIG. 1, a first electrode 2 is formed on a substrate 1, and an electron transport layer 4 is formed on the first electrode 2. The electron transport layer 4 contains an electron transport compound 11 that is carrying a sensitizing dye 5 and a co-adsorbent 6. The electron transport layer 4 and a second electrode 8 is sandwiching a charge transfer layer 7. Electricity may be taken out from the first electrode 2 and the second electrode 8 via lead lines 9 and 10.

Figure 2:
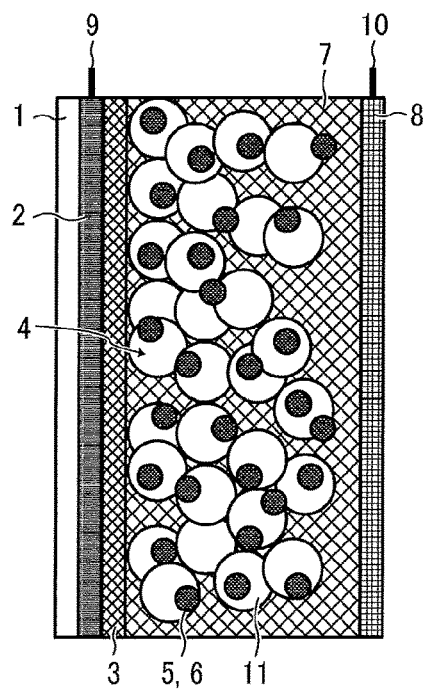
FIG. 2 is a cross-sectional view of a photoelectric conversion element in accordance with some embodiments of the present invention.

FIG. 2 is a cross-sectional view of a photoelectric conversion element according to another embodiment of the present invention. Referring to FIG. 2, a blocking layer 3 is disposed between the first electrode 2 and the electron transport layer 4. Description for the elements similar to those shown in FIG. 1 is omitted.

Figure 3:
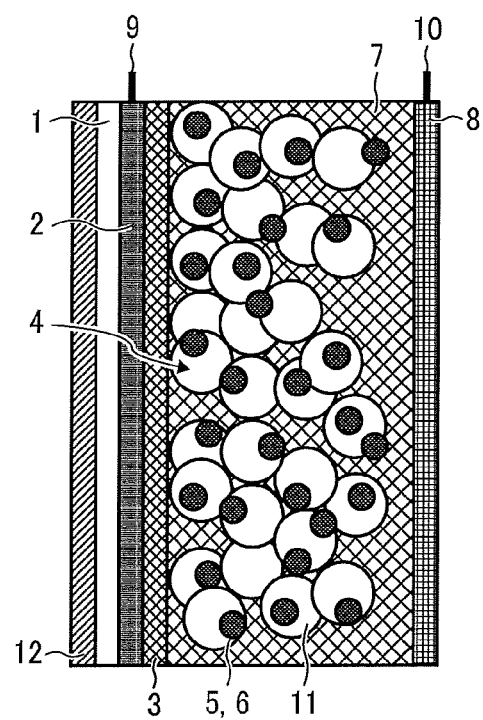
FIG. 3 is a cross-sectional view of a photoelectric conversion element in accordance with some embodiments of the present invention.

FIG. 3 is a cross-sectional view of a photoelectric conversion element according to another embodiment of the present invention. Referring to FIG. 3, an absorption wavelength control layer 12 is disposed on one side of the first electrode 2 opposite to the electron transport layer 4. Description for the elements similar to those shown in FIG. 1 is omitted. Although the blocking layer 3 is illustrated in FIG. 3, the blocking layer 3 and the absorption wavelength control layer 12 do not need to be present at the same time but may exist separately.

Figure 4A:
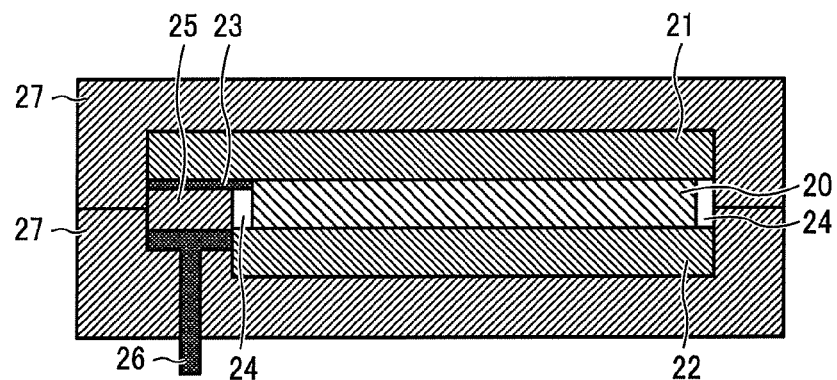
FIG. 4A is a cross-sectional view of a photoelectric conversion element in accordance with some embodiments of the present invention.
Figure 4B:
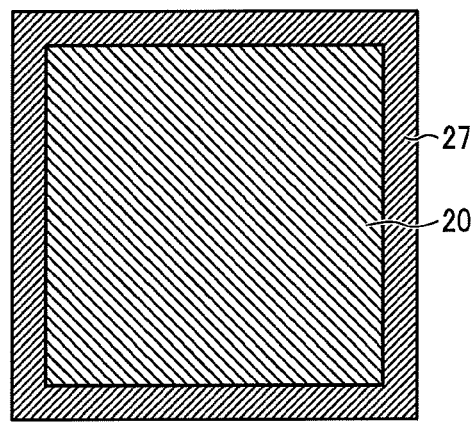
FIG. 4B is a schematic view of a light receiving section in the photoelectric conversion element illustrated in FIG. 4A.

FIG. 4A is a cross-sectional view of a photoelectric conversion element according to another embodiment of the present invention, having a flame structure. FIG. 4B is a schematic view of a light receiving section in the photoelectric conversion element illustrated in FIG. 4A. Description for the elements similar to those shown in FIG. 1 is omitted.

First Electrode

The first electrode 2 may be formed by disposing an electrode material on the substrate 1 as a separate body. Alternatively, the first electrode 2 may be integrated with the substrate 1.

The first electrode 2 is preferably made of a visible-light-transmissive conductive material. Examples of the visible-light-transmissive conductive material include those conventionally used for photoelectric conversion elements and liquid crystal panels. Specific examples of such materials include, but are not limited to, indium-tin oxide (ITO), fluorine-doped tin oxide (FTO), antimony-doped tin oxide (ATO), indium-zinc oxide, niobium-titanium oxide, and graphene. Each of these substances may be used alone to form a single layer or in combination with others to form a multilayer.

Preferably, the first electrode 2 has a thickness of from 5 nm to 100 μm, and more preferably from 50 nm to 10 μm.

To maintain a constant level of rigidity, the first electrode 2 is preferably formed on the substrate 1 made of a visible-light-transmissive material such as a glass plate, a transparent plastic plate, a transparent plastic film, and an inorganic transparent crystalline body.

A combined body of the first electrode 2 and the substrate 1 may also be used. Examples of such a combined body include, but are not limited to, an FTO-coated glass plate, an ITO-coated glass plate, a zinc-oxide-and-aluminum-coated glass plate, an FTO-coated transparent plastic film, and an ITO-coated transparent plastic film.

In addition, a combined body of a substrate (such as glass substrate) with a transparent electrode made of tin oxide or indium oxide doped with a cation or anion having a different atomic valence, or with a metallic electrode having a mesh-like or stripe-like structure to be light transmissive, can also be used. Each of these materials can be used alone, or mixed with or laminated on the others.

For the purpose of reducing resistance, metallic lead wires may be used in combination. The metallic lead wire may be made of aluminum, copper, silver, gold, platinum, or nickel. The metallic lead wire may be disposed to the substrate by means of vapor deposition, sputtering, or pressure bonding, and ITO or FTO may be further disposed thereon.

Blocking Layer

In accordance with some embodiments of the present invention, the blocking layer 3 may be disposed between the first electrode 2 and the electron transport layer 4. The blocking layer 3 may comprise a thin film of a semiconductor. For example, a dense and thin film of the blocking layer 3 may be formed on the first electrode 2, and the electron transport layer 4 may be further formed on the electron transport layer 4, thus forming a laminated structure.

The blocking layer 3 is formed for the purpose of preventing the first electrode 2 and the charge transfer layer 7 from electrically contacting with each other. Therefore, formation of pinhole, crack, or the like is acceptable unless the first electrode 2 and the charge transfer layer 7 physically come into contact with each other.

Preferably, the film thickness of the blocking layer 3 is from 10 nm to 1 µm, and more preferably from 20 to 700 nm.

The blocking layer 3 is not limited in constitutional material. Specific examples of the constitutional material include, but are not limited to, single-body semiconductors such as silicon and germanium, compound semiconductors such as metal chalcogenides, and compounds having a perovskite structure.

Specific examples of the metal chalcogenides include, but are not limited to, oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and tellurides of cadmium.

Specific examples of the compound semiconductors include, but are not limited to, phosphides of zinc, gallium, indium, and cadmium; gallium arsenide; copper-indium selenide; and copper-indium sulfide.

Specific examples of the compounds having a perovskite structure include, but are not limited to, strontium titanate, calcium titanate, sodium titanate, barium titanate, and potassium niobate.

Among these materials, oxide semiconductors are preferable, and titanium oxide, zinc oxide, tin oxide, and niobium oxide are more preferable. Each of these materials can be used alone or in combination with others. These semiconductors are not limited in crystal type and may be either single crystalline, polycrystalline, or amorphous.

Electron Transport Layer

The electron transport layer 4 is formed on the first electrode 2 or the blocking layer 3, and contains the electron transport compound 11 (hereinafter also referred to as "electron transport particles") carrying the compound represented by the formula (1) and the compound represented by the formula (2). The electron transport layer 4 may be porous. The electron transport layer 4 may be either single-layered or multi-layered. In the case of multi-layer, multiple dispersion liquids containing semiconductor particles of different particle diameters may be applied multiply, or multiple layers of different kinds of semiconductors or different compositions of resins and additives may be applied multiply. In a case in which the film thickness is insufficient as a result of single application, multiple application is effective.

Generally, as the thickness of the electron transport layer 4 increases, the amount of sensitizing dye carried per unit projected area increases, and therefore the light capture rate increases. However, at the same time, the diffusion distance of injected electrons also increases, thus increasing loss caused due to recombination of charge. Accordingly, the film thickness of the electron transport layer 4 is preferably in the range of from 100 nm to 100 µm.

Electron Transport Compound

The electron transport compound 11 contained in the electron transport layer 4 is not limited in constitutional material. Specific examples of the constitutional material include, but are not limited to, single-body semiconductors such as silicon and germanium, compound semiconductors such as metal chalcogenides, and compounds having a perovskite structure.

Specific examples of the metal chalcogenides include, but are not limited to, oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and tellurides of cadmium.

Specific examples of the compound semiconductors include, but are not limited to, phosphides of zinc, gallium, indium, and cadmium; gallium arsenide; copper-indium selenide; and copper-indium sulfide.

Specific examples of the compounds having a perovskite structure include, but are not limited to, strontium titanate, calcium titanate, sodium titanate, barium titanate, and potassium niobate.

Among these materials, oxide semiconductors, in particular, n-type oxide semiconductors are preferable, and titanium oxide, zinc oxide, tin oxide, and niobium oxide are more preferable. Each of these materials can be used alone or in combination with others. These semiconductors are not limited in crystal type and may be either single crystalline, polycrystalline, or amorphous.

The electron transport compound 11 used for the electron transport layer 4 is not limited in particle size. Preferably, the average particle diameter of primary particles thereof is in the range of from 1 to 100 nm, more preferably from 5 to 50 nm.

It is possible to improve efficiency by further mixing or stacking other semiconductor particles having a greater average particle diameter to allow incident light to scatter. In this case, the average particle diameter of the semiconductor particles is preferably in the range of from 50 to 500 nm.

The electron transport layer 4 is not limited in its formation method and can be formed by, for example, a vacuum film-forming method, such as sputtering, or a wet film-forming method. For reducing production cost, wet film-forming methods are preferable. Specifically, a method of applying a paste dispersing a powder or sol of semiconductor particles onto the first electrode 2 is preferable.

In this wet film-forming method, how to apply the coating liquid is not particularly limited. For example, the paste may be applied by means of dipping, spraying, wire bar, spin coating, roller coating, blade coating, gravure coating, or wet printing such as relief, offset, gravure, intaglio, rubber plate, and screen printings.

A dispersion liquid of semiconductor particles may be prepared by means of mechanical pulverization or mill, specifically by dispersing at least the semiconductor particles alone or a mixture of the semiconductor particles with a resin in water or an organic solvent.

Specific examples of the resin mixed with the semiconductor particles include, but are not limited to, homopolymers and copolymers of vinyl compounds such as styrene, vinyl acetate, acrylate, and methacrylate; and silicone resin, phenoxy resin, polysulfone resin, polyvinyl butyral resin, polyvinyl formal resin, polyester resin, cellulose ester resin, cellulose ether resin, urethane resin, phenol resin, epoxy resin, polycarbonate resin, polyarylate resin, polyamide resin, and polyimide resin.

Specific examples of the solvent for dispersing the electron transport particles used for the electron transport layer 4 include, but are not limited to, water; alcohol solvents such as methanol, ethanol, isopropyl alcohol, and α-terpineol; ketone solvents such as acetone, methyl ethyl ketone, and methyl isobutyl ketone; ester solvents such as ethyl formate, ethyl acetate, n-butyl acetate; ether solvents such as diethyl ether, dimethoxyethane, tetrahydrofuran, dioxolan, and dioxane; amide solvents such as N,N-dimethylformamide, N,N-dimethylacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene. These solvents can be used alone or in combination with others as a mixed solvent.

To prevent reaggregation of the electron transport particles used for the electron transport layer 4 in the dispersion liquid thereof or the paste thereof obtained by a sol-gel method, etc., an acid (e.g., hydrochloric acid, nitric acid, and acetic acid), a surfactant (e.g., polyoxyethylene(10) octyl phenyl ether), or a chelator (e.g., acetyl acetone, 2-aminoethanol, and ethylenediamine) may be added thereto.

To improve film-forming performance, a thickener can also be added.

Specific examples of the thickener include, but are not limited to, polymers such as polyethylene glycol and polyvinyl alcohol, and ethyl cellulose.

It is preferable that the electron transport particles used for the electron transport layer 4 having been applied are brought into electronic contact with each other and exposed to burning, microwave irradiation, electron beam irradiation, or laser light irradiation, for increasing the film strength and adhesion to the substrate. Each of these treatments can be conducted alone or in combination with others.

In the burning, the burning temperature is preferably in the range of from 30° C. to 700° C., more preferably from 100° C. to 600° C., but is not limited thereto. When the burning temperature is excessively raised, the resistance of the substrate may become too high or the substrate may melt. The burning time is preferably from 10 minutes to 10 hours, but is not limited thereto.

After the burning, for the purpose of increasing the surface area of the particles as well as increasing the efficiency of electron injection from the sensitizing dye to the particles in the electron transport layer 4, a chemical plating treatment using an aqueous solution of titanium tetrachloride or a mixed solution thereof with an organic solvent, or an electrochemical plating treatment using an aqueous solution of titanium trichloride may be conducted.

In the microwave irradiation, the electron transport layer may be irradiated from either the layer-formed side or the opposite side thereof. The irradiation time is preferably within 1 hour, but is not limited thereto.

A film in which the electron transport particles having a diameter of several tens nanometers are stacked by sintering, etc., forms a porous structure of the electron transport layer 4. Such a nano porous structure has a very large surface area. The surface area can be represented by a roughness factor. The roughness factor is a numerical value indicating the ratio of the actual area of the inside of the porous structure to the surface area of the semiconductor particles applied to the substrate. Accordingly, the higher the roughness factor, the better. In view of the thickness of the electron transport layer 4, the roughness factor is preferably 20 or more.

Sensitizing Dye

For more improving conversion efficiency, the sensitizing dye 5 is adsorbed to the surface of the electron transport compound 11 in the electron transport layer 4. As the sensitizing dye 5, the compound represented by the following formula (1) is used.

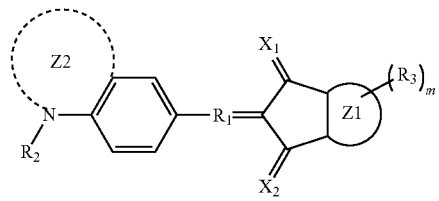

Formula (1)

In the formula (1), each of $X_1$ and $X_2$ independently represents oxygen atom, sulfur atom, or selenium atom; $R_1$ represents methine group; $R_2$ represents an alkyl group, an aryl group, or a heterocyclic group; each of $R_3$ independently represents an acidic group; m represents an integer of 1 or 2; and each of $Z_1$ and $Z_2$ independently represents a group forming a cyclic structure.

In the formula (1), each of $X_1$ and $X_2$ independently represents oxygen atom, sulfur atom, or selenium atom.

$R_1$ represents methine group and may have a substituent. Specific examples of the substituent include, but are not limited to, aryl groups such as phenyl group and naphthyl group; and hetero rings such as thienyl group and furyl group.

$R_2$ represents an alkyl group, an aryl group, or a heterocyclic group, and may have a substituent.

Specific examples of the alkyl group include, but are not limited to, methyl group, ethyl group, 2-propyl group, and 2-ethylhexyl group.

Specific examples of the aryl group include those exemplified above.

Specific examples of the heterocyclic group include those exemplified above.

Specific examples of the substituent for the $R_2$ include, but are not limited to, alkyl groups, alkoxy groups, aryl groups, and heterocyclic groups, particularly those exemplified above.

Each of $R_3$ independently represents an acidic group, and m represents an integer of 1 or 2. Specific examples of the acidic group include, but are not limited to, carboxylic acid, sulfonic acid, phosphonic acid, boronic acid, and phenols. Preferably, the acidic group is bindable to the electron transport compound.

Each of $Z_1$ and $Z_2$ independently represents a group forming a cyclic structure, and may have a substituent.

Specific examples of $Z_1$ include, but are not limited to, condensed hydrocarbon compounds such as benzene ring and naphthalene ring; and hetero rings such as thiophene ring and furan ring. $Z_1$ may have a substituent. Specific examples of the substituent include, but are not limited to, the above-exemplified alkyl groups; and alkoxy groups such as methoxy group, ethoxy group, and 2-isopropoxy group.

Specific examples of $Z_2$ are shown in the following example compounds (A-1) to (A-22), but are not limited thereto. It is to be noted that the following compounds each contain benzene ring, nitrogen atom, etc., bound to $Z_2$, together with $Z_2$.

(A-1)

(A-2)

(A-3)

(A-4)

(A-5)

(A-6)

(A-7)

-continued (A-8)
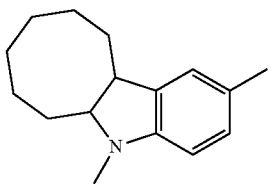

(A-9)

(A-10)
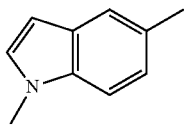

(A-11)
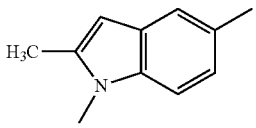

(A-12)
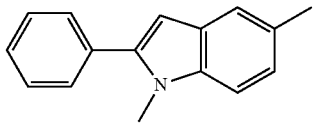

(A-13)

(A-14)
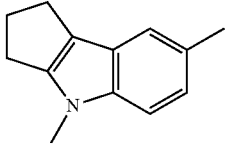

(A-15)
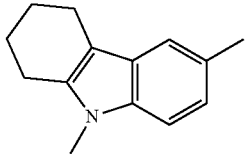

(A-16)
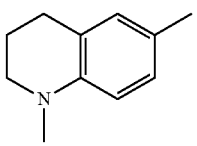

(A-17)
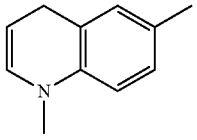

(A-18)
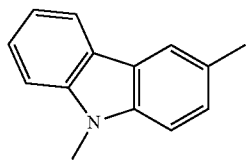

(A-19)
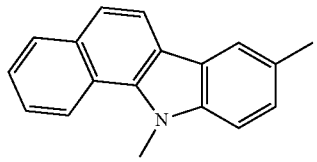

(A-20)
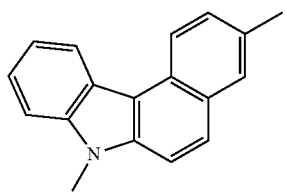

(A-21)
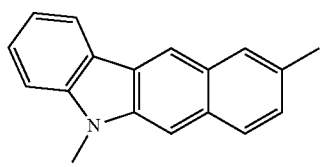

(A-22)
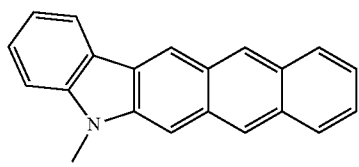

Preferably, the compound represented by the formula (1) is further represented by the following formula (3) or (4).

Formula (3)
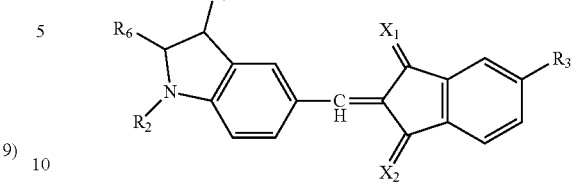

In the formula (3), each of $X_1$ and $X_2$ independently represents oxygen atom or sulfur atom; $R_2$ represents an alkyl group, an aryl group, or a heterocyclic group; $R_3$ represents an acidic group; and each of $R_6$ and $R_7$ independently represents an alkyl group, an aryl group, or a non-cyclic structure, or $R_6$ and $R_7$ share bond connectivity to form a cyclic structure.

Formula (4)
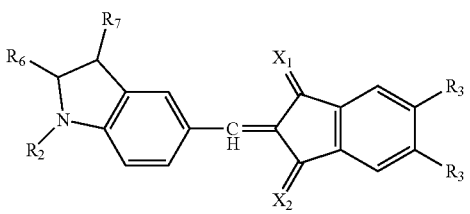

In the formula (4), each of $X_1$ and $X_2$ independently represents oxygen atom or sulfur atom; $R_2$ represents an alkyl group, an aryl group, or a heterocyclic group; each of $R_3$ independently represents an acidic group; and each of $R_6$ and $R_7$ independently represents an alkyl group, an aryl group, or a non-cyclic structure, or $R_6$ and $R_7$ share bond connectivity to form a cyclic structure.

Each of $R_2$, $R_6$, and $R_7$ may have a substituent.

Specific examples of the compound represented by the formula (1) include, but are not limited to, the following example compounds (B-1) to (B-38).

(B-1)
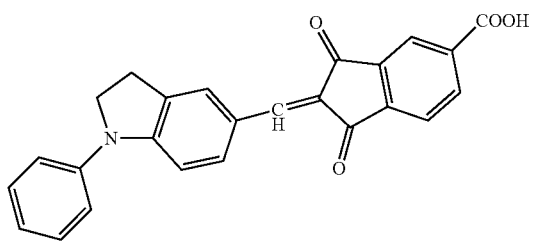

(B-2)
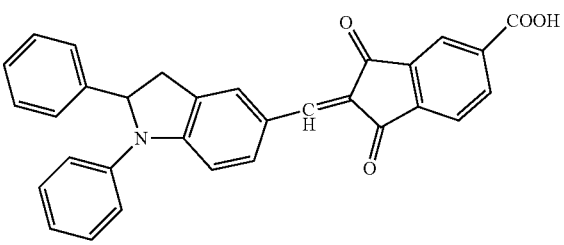

(B-3)
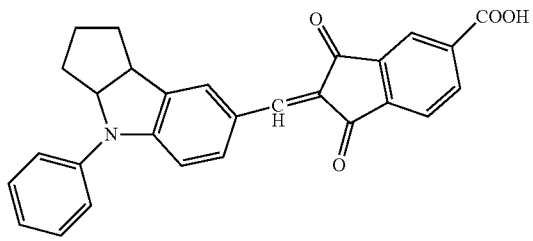

(B-4)
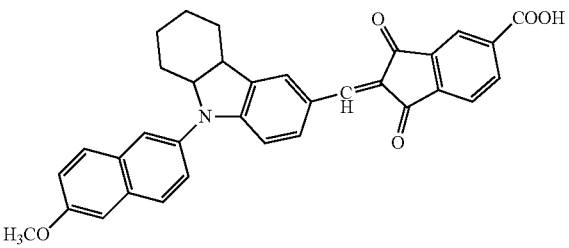

-continued
(B-5)
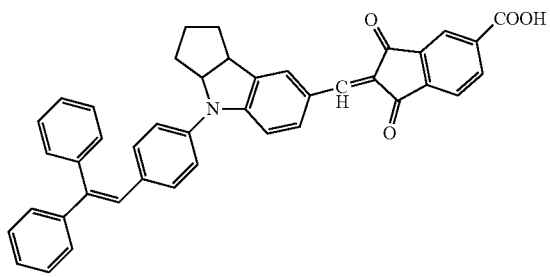
(B-6)
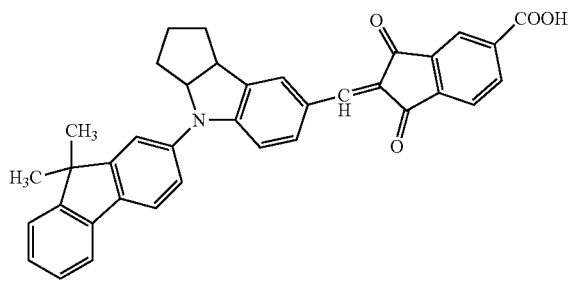
(B-7)
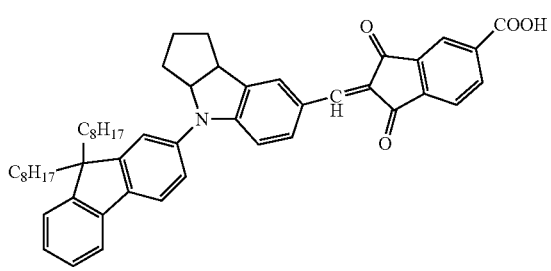
(B-8)
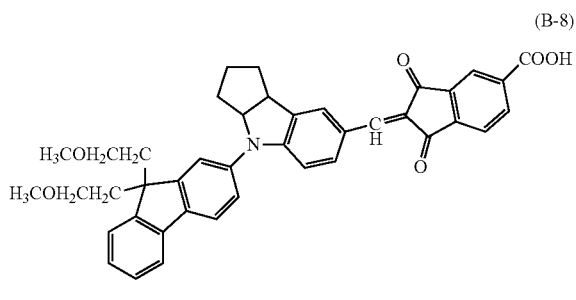
(B-9)
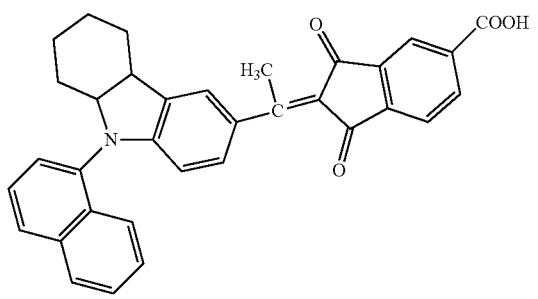
(B-10)
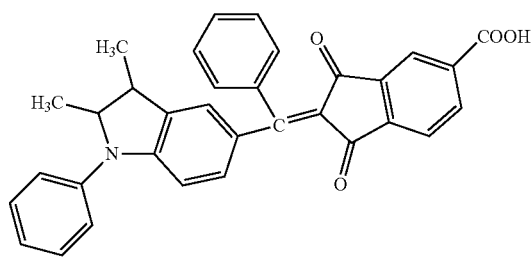
(B-11)
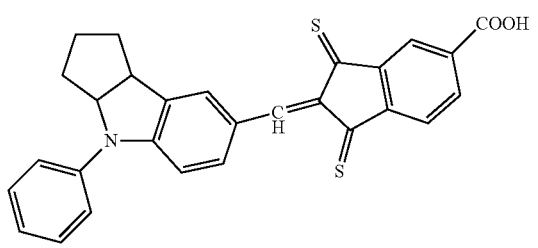
(B-12)
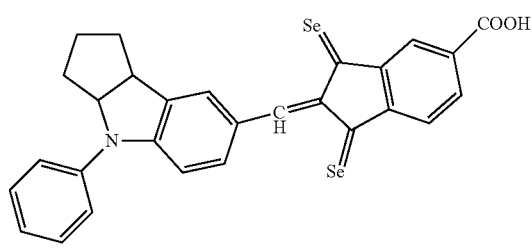
(B-13)
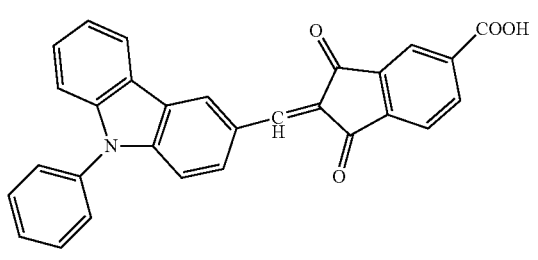
(B-14)
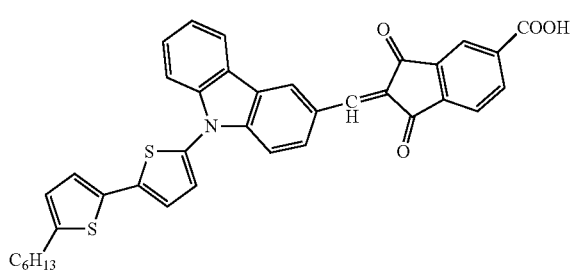

-continued
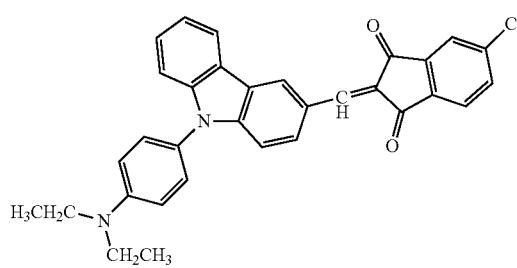
(B-15)
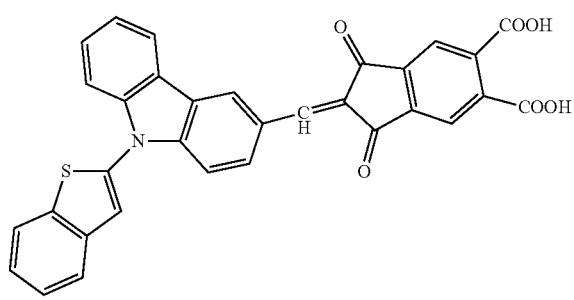
(B-16)
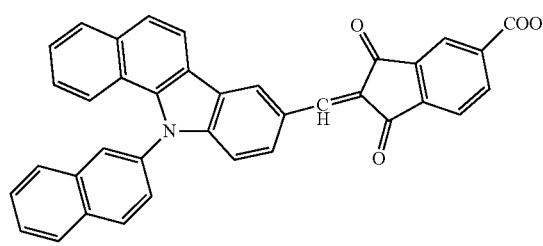
(B-17)
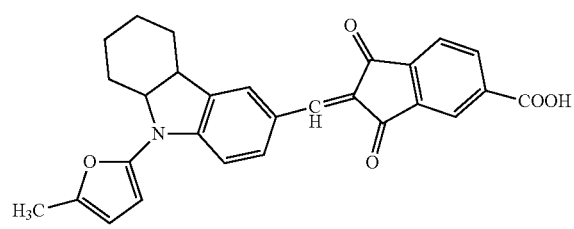
(B-18)
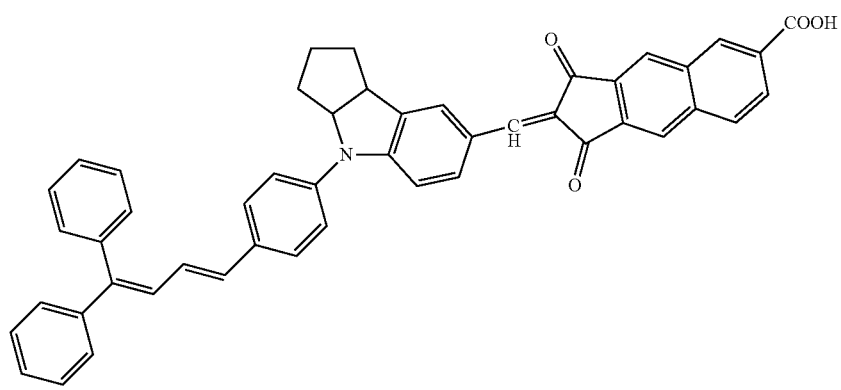
(B-19)
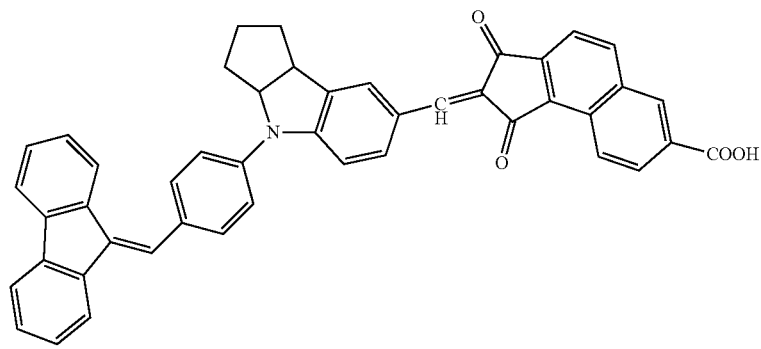
(B-20)
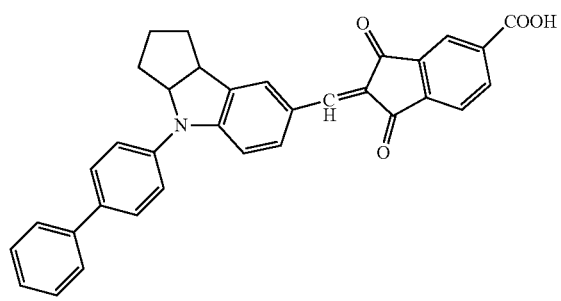
(B-21)
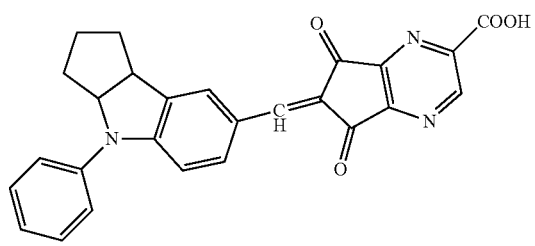
(B-22)

-continued
(B-23)
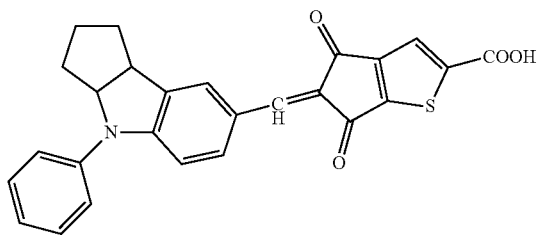
(B-24)
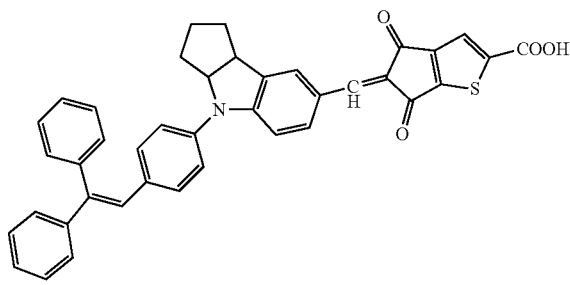
(B-25)
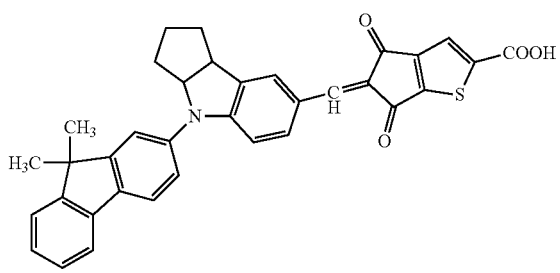
(B-26)
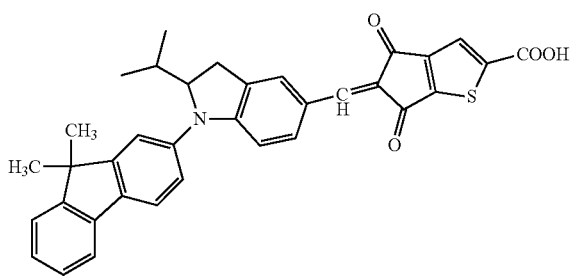
(B-27)
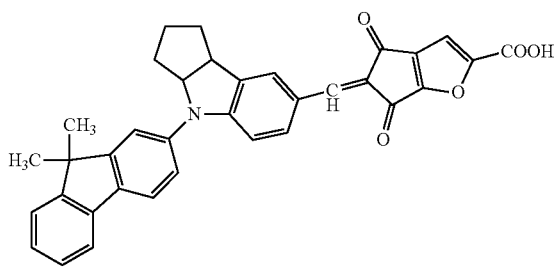
(B-28)
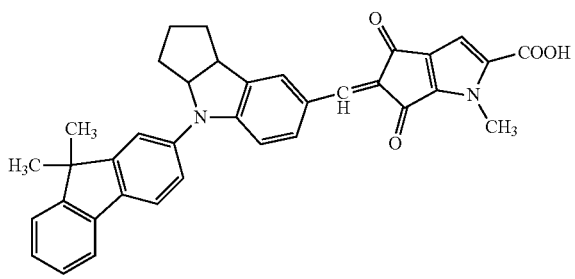
(B-29)
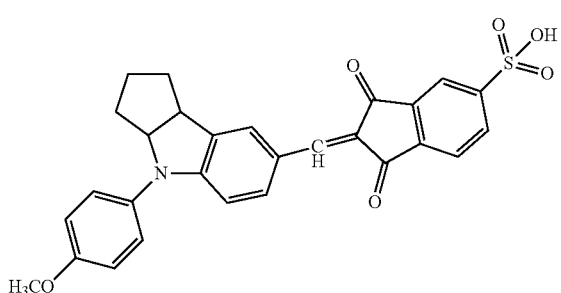
(B-30)
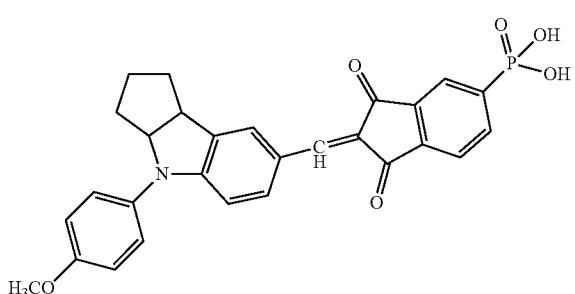
(B-31)
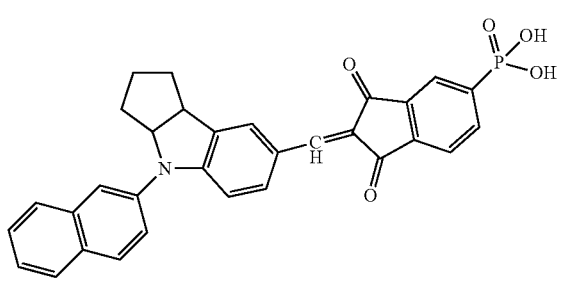
(B-32)
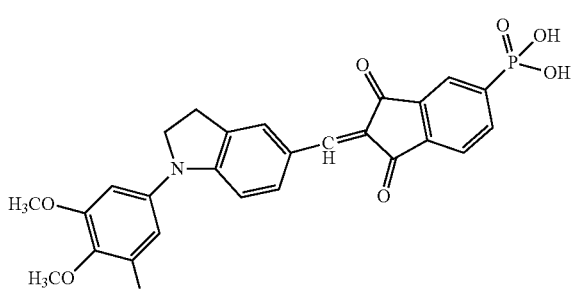

-continued

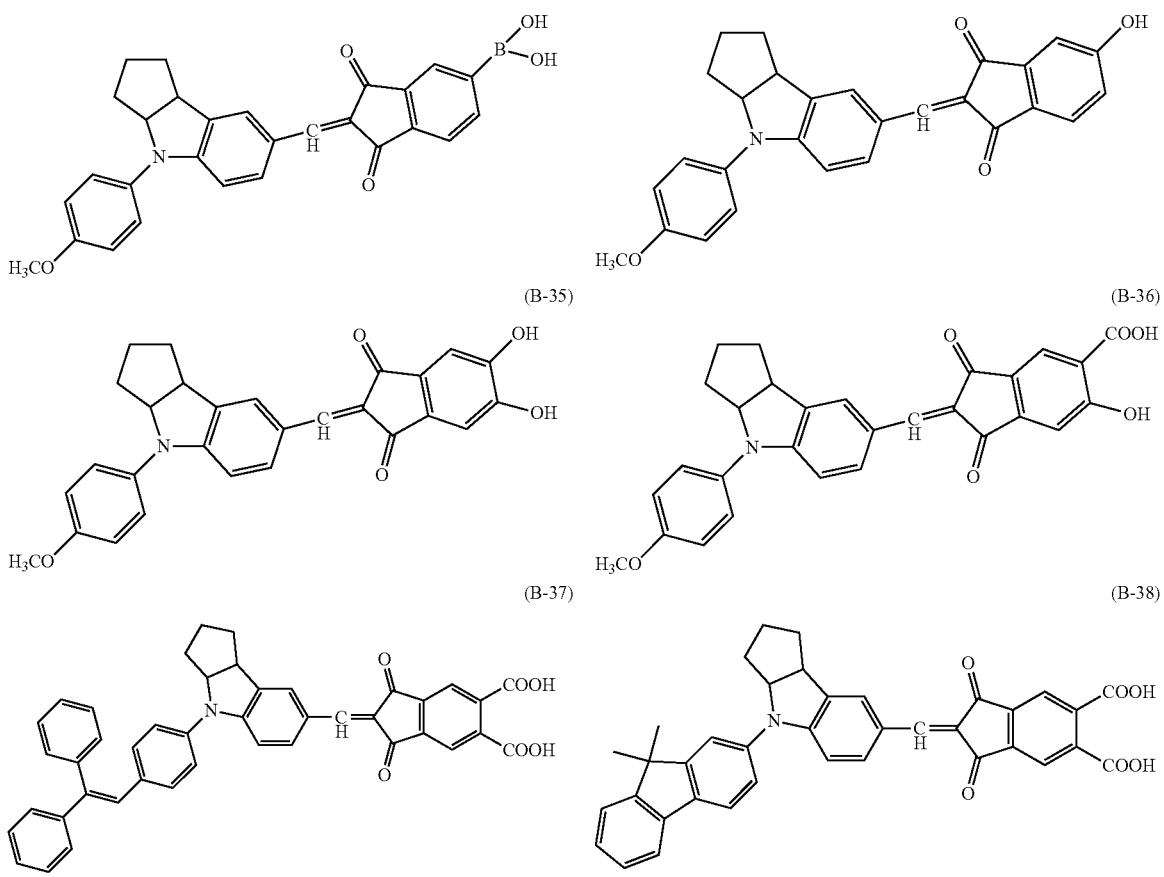

The sensitizing dye 5, i.e., the compound represented by the formula (1), may be used alone or in combination with other sensitizing dyes. Examples of sensitizing dyes to be mixed with the compound represented by the formula (1) include, but are not limited to: metal complex compounds described in JP-07-500630-A, JP-10-233238-A, JP-2000-26487-A, JP-2000-323191-A, and JP-2001-59062; coumarin compounds described in JP-10-93118-A, JP-2002-164089-A, JP-2004-95450-A, and J. Phys. Chem. C., 7224, Vol. 111 (2007); polyene compounds described in JP-2004-95450 and Chem. Commun., 4887 (2007); indoline compounds described in JP-2003-264010-A, JP-2004-63274-A, JP-2004-115636-A, JP-2004-200068-A, JP-2004-235052-A, J. Am. Chem. Soc., 12218, Vol. 126 (2004), Chem. Commum., 3036 (2003), and Angew. Chem. Int. Ed., 1923, Vol. 47 (2008); thiophene compounds described in J. Am. Chem. Soc., 16701, Vol. 128 (2006) and J. Am. Chem. Soc., 14256, Vol. 128 (2006); cyanine dyes described in JP-11-86916-A, JP-11-214730-A, JP-2000-106224-A, JP-2001-76773-A, and JP-2003-7359-A; merocyanine dyes described in JP-11-214731-A, JP-11-238905-A, JP-2001-52766-A, JP-2001-76775-A, and JP-2003-7360-A; 9-aryl xanthene compounds described in JP-10-92477-A, JP-11-273754-A, JP-11-273755-A, and JP-2003-31273-A; triarylmethane compounds described in JP-10-93118-A and JP-2003-31273-A; and phthalocyanine compounds and porphyrin compounds described in JP-09-199744-A, JP-10-233238-A, JP-11-204821-A, JP-11-265738-A, J. Phys. Chem., 2342, Vol. 91 (1987), J. Phys. Chem. B, 6272, Vol. 97 (1993), Electroanal. Chem., 31, Vol. 537 (2002), JP-2006-032260-A, J. Porphyrins Phthalocyanines, 230, Vol. 3 (1999), Angew. Chem. Int. Ed., 373, Vol. 46 (2007), and Langmuir, 5436, Vol. 24 (2008).

The sensitizing dye can be adsorbed to the electron transport layer 4 by dipping the electron transport particles used for the electron transport layer 4 in a solution or dispersion of the sensitizing dye, or applying the solution or dispersion of the sensitizing dye to the electron transport layer 4.

In the former case, for example, an immersion method, a dipping method, a roller method, or an air knife method may be employed. In the latter case, for example, a wire bar method, a slide hopper method, an extrusion method, a curtain method, a spin method, or a spray method may be employed.

Alternatively, the adsorption can be performed in a supercritical fluid of carbon dioxide etc.

When adsorbing the sensitizing dye, a condensation agent can be used in combination.

The condensation agent may act as a catalyst for physically or chemically binding the sensitizing dye and the electron transport particles used for the electron transport layer 4 to a surface of an inorganic material, or may stoichiometrically act for advantageously transfer chemical equilibrium.

Further, a condensation auxiliary agent, such as a thiol and a hydroxy compound, may be used in combination.

Specific examples of solvents for dissolving or dispersing the sensitizing dye include, but are not limited to, water;

alcohol solvents such as methanol, ethanol, and isopropyl alcohol; ketone solvents such as acetone, methyl ethyl ketone, and methyl isobutyl ketone; ester solvents such as ethyl formate, ethyl acetate, and n-butyl acetate; ether solvents such as diethyl ether, dimethoxyethane, tetrahydrofuran, dioxolan, and dioxane; amide solvents such as N,N-dimethylformamide, N,N-dimethylacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene. These solvents can be used alone or in combination with others.

Preferably, the content of the compound represented by the formula (1) is from 0.00001 to 0.01 parts by mass based on 100 parts by mass of the solvent.

The electron transport compound 11 is further carrying the compound represented by the following formula (2). The compound represented by the formula (2) acts as a co-adsorbent (aggregation dissociating agent) that suppresses interaction between the sensitizing dye compounds.

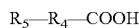  Formula (2)

In the formula (2), $R_4$ represents an aryl group or a heterocyclic group; and $R_5$ represents an alkyl group, an alkoxy group, an alkenyl group, an alkylthio group, or an aryl ether group.

Each of $R_4$ and $R_5$ may have a substituent.

Preferably, the compound represented by the formula (2) is further represented by the following formula (5).

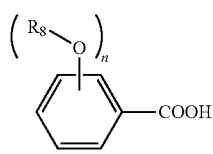  Formula (5)

In the formula (5), $R_8$ represents an alkyl group, an alkenyl group, or an aryl group; and n represents an integer of from 1 to 3.

$R_8$ may have a substituent.

Specific examples of the compound represented by the formula (2) include, but are not limited to, the following example compounds (C-01) to (C-55).

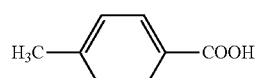 (C-01)

 (C-02)

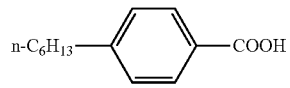 (C-03)

-continued

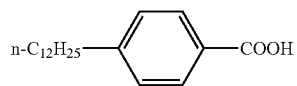 (C-04)

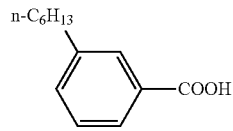 (C-05)

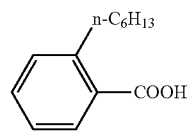 (C-06)

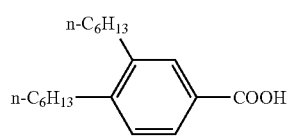 (C-07)

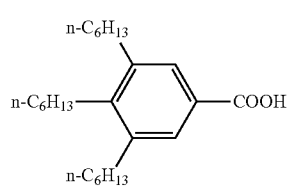 (C-08)

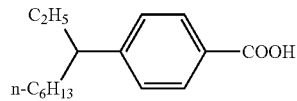 (C-09)

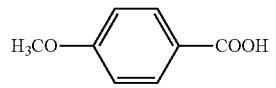 (C-10)

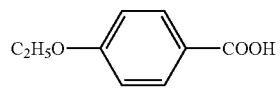 (C-11)

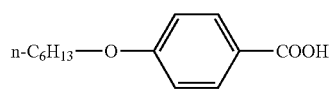 (C-12)

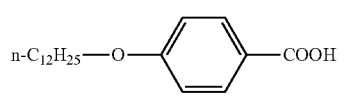 (C-13)

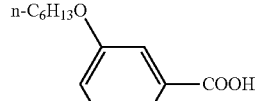 (C-14)

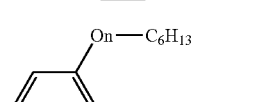 (C-15)

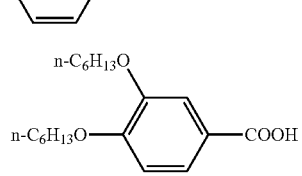 (C-16)

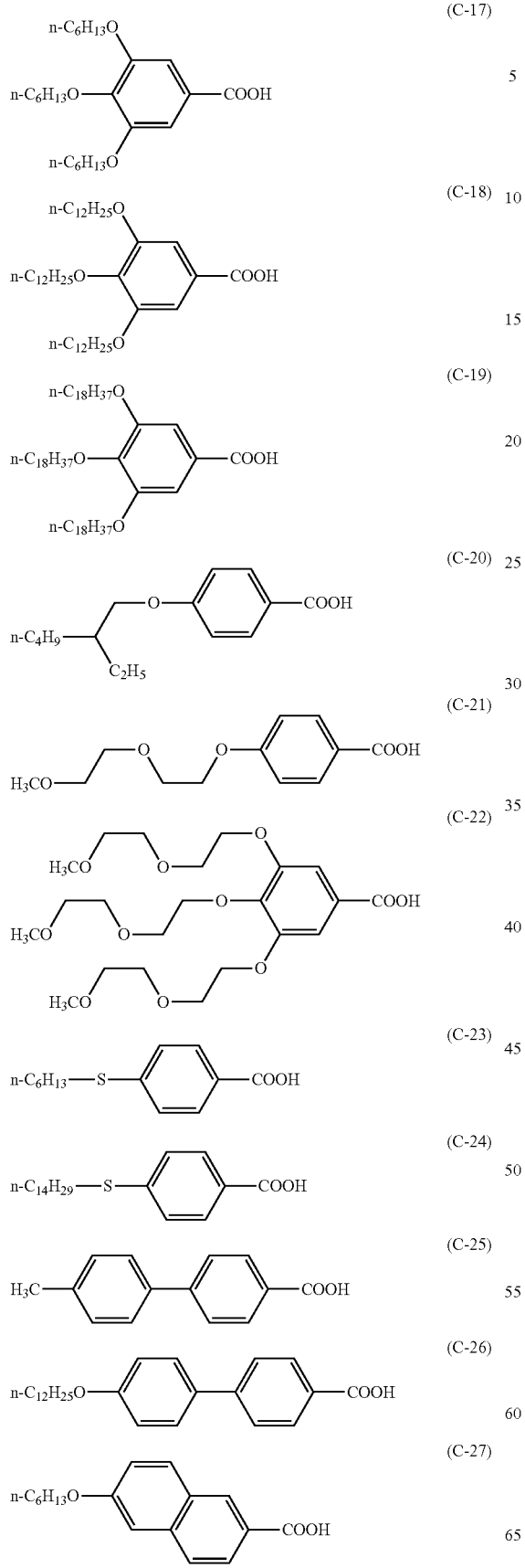
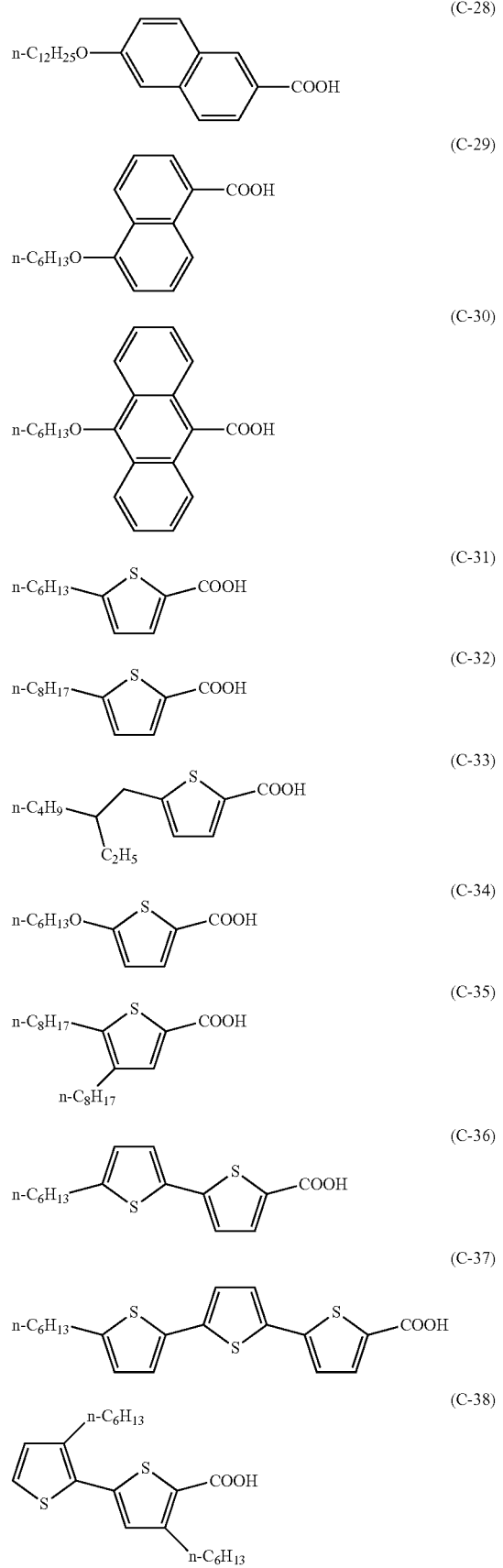

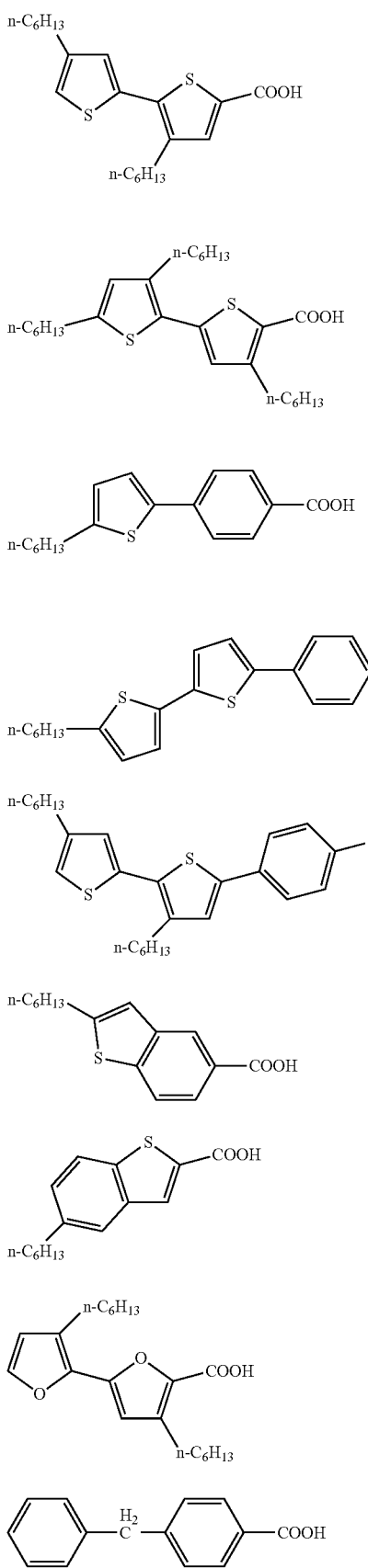
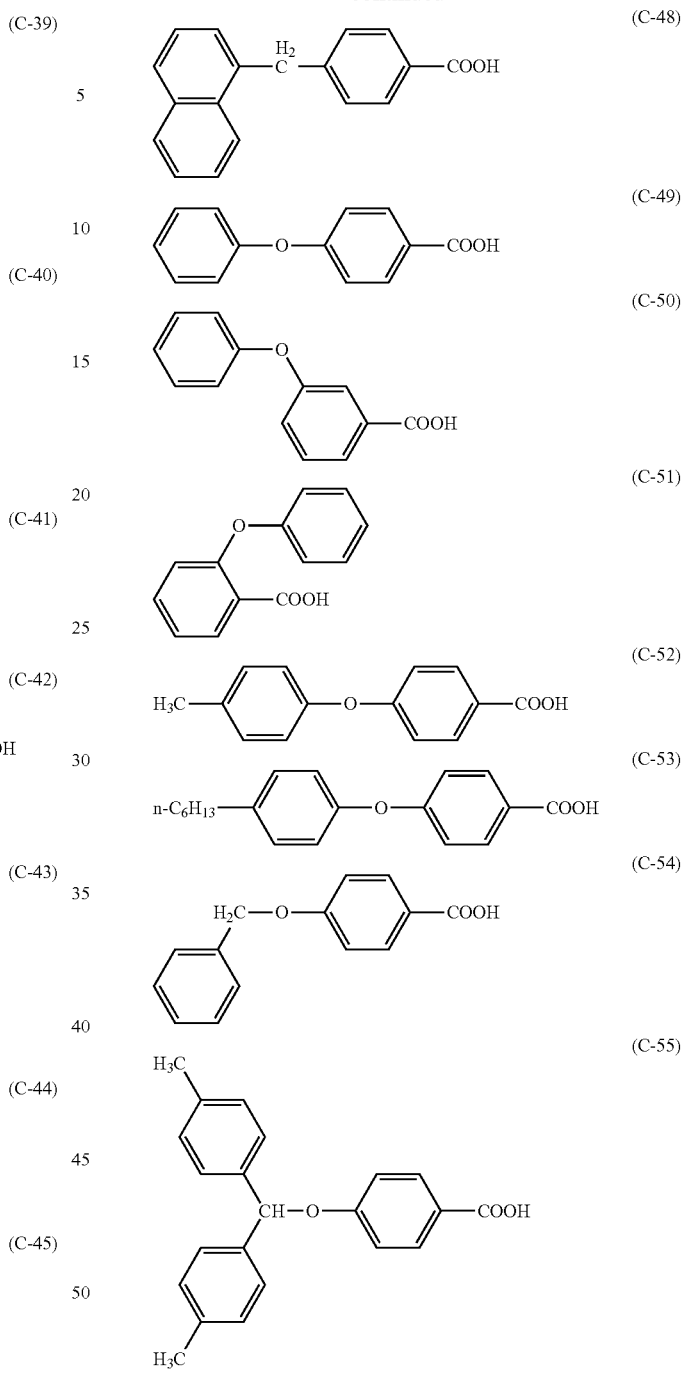

Preferably, the addition amount of the compound represented by the formula (2) is from 0.01 to 500 parts by mass, more preferably from 0.1 to 100 parts by mass, based on 1 part by mass of the compound represented by the formula (1).

Preferably, the temperature at the adsorption of the sensitizing dye and the co-adsorbent to the electron transport compound is in the range of from −50° C. to 200° C.

The adsorption may be performed under either static condition or stirring. The stirring may be performed by, for example, a stirrer, a ball mill, a paint conditioner, a sand mill, an attritor, a disperser, or an ultrasonic disperser.

The time required for the adsorption is, preferably, from 5 seconds to 1,000 hours, more preferably from 10 seconds to 500 hours, and most preferably from 1 minute to 150 hours. Preferably, the adsorption is performed in dark place.

The adsorption process may be any of the following processes: adsorbing the sensitizing dye first and thereafter the co-adsorbent; adsorbing the co-adsorbent first and thereafter the sensitizing dye; or previously dissolving the sensitizing dye and the co-adsorbent in the same solvent and adsorbing them at the same time.

The combination of the sensitizing dye represented by the formula (1) and the co-adsorbent represented by the formula (2) can be easily detected by HPLC (high-performance liquid chromatography). Therefore, it is easy to measure the concentrations of the sensitizing dye and the co-adsorbent dissolved in the dye solution and to manage the dye solution.

Charge Transfer Layer

The charge transfer layer 7 may comprise an electrolytic solution in which a redox pair is dissolved in an organic solvent, a gel electrolyte in which an organic solvent solution of a redox pair is impregnated in a polymer matrix, a molten salt containing a redox pair, a solid electrolyte, an inorganic hole transport material, and/or an organic hole transport material.

Preferably, the electrolytic solution comprises an electrolyte, a solvent, and an additive. Specific preferred examples of the electrolyte include, but are not limited to, combinations of metal iodides (e.g., lithium iodide, sodium iodide, potassium iodide, cesium iodide, and calcium iodide) with iodine; combinations of iodine salts of quaternary ammonium compounds (e.g., tetraalkylammonium iodide, pyridinium iodide, and imidazolium iodide) with iodine; combinations of metal bromides (e.g., lithium bromide, sodium bromide, potassium bromide, cesium bromide, and calcium bromide) with bromine; combinations of bromine salts of quaternary ammonium compounds (e.g., tetraalkylammonium bromide and pyridinium bromide) with bromine; metal complexes such as ferrocyanate-ferricyanate and ferrocene-ferricinium ion; sulfur compounds such as sodium polysulfide and alkyl thiol-alkyl disulfide; viologen dye; hydroquinone-quinone; metal complexes of cobalt; and nitroxide radical compounds. Each of these electrolytes can be used alone or in combination with others. Ionic liquids, such as imidazolinium iodide, may be used alone without using any solvent.

Preferably, the electrolyte concentration in the electrolytic solution is from 0.05 to 20 M, and more preferably from 0.1 to 15 M. Specific preferred examples of the solvent used for the electrolytic solution include, but are not limited to: carbonate solvents such as ethylene carbonate and propylene carbonate; heterocyclic compounds such as 3-methyl-2-oxazolidinone; ether solvents such as dioxane, diethyl ether, and ethylene glycol dialkyl ether; alcohol solvents such as methanol, ethanol, and polypropylene glycol monoalkyl ether; nitrile solvents such as acetonitrile and benzonitrile; and aprotic polar solvents such as dimethylsulfoxide and sulfolane. The solvent may be used in combination with a basic compound such as t-butylpyridine, 2-picoline, and 2,6-lutidine.

The electrolyte may be gelated by means of addition of a polymer, addition of an oil gelator, polymerization of monomers including a polyfunctional monomer, or a cross-linking reaction of a polymer. In a case in which gelation is performed by addition of a polymer, specific preferred examples of the polymer include, but are not limited to, polyacrylonitrile and polyvinylidene fluoride. In a case in which gelation is performed by addition of an oil gelator, specific preferred examples of the oil gelator include, but are not limited to, cholesterol derivatives and amino acid derivatives of dibenzylidene-D-sorbitol, alkylamide derivatives and alkyl urea derivatives of trans-(1R,2R)-1,2-cyclohexanediamine, and dual amino acid derivatives and quaternary ammonium derivatives of N-octyl-D-gluconamide benzoate.

In a case in which gelation is performed by polymerization of monomers including a polyfunctional monomer, specific preferred examples of the polyfunctional monomer include, but are not limited to, divinylbenzene, ethylene glycol dimethacrylate, ethylene glycol diacrylate, diethylene glycol dimethacrylate, triethylene glycol dimethacrylate, pentaerythritol triacrylate, and trimethylolpropane triacrylate. The monomers may further include a monofunctional monomer. Specific examples of the monofunctional monomer include, but are not limited to, esters and amides derived from acrylic acid or α-alkyl acrylic acid (e.g., acrylamide and methyl acrylate), esters derived from maleic acid or fumaric acid (e.g., dimethyl maleate and diethyl fumarate), dienes (e.g., butadiene and cyclopentadiene), aromatic vinyl compounds (e.g., styrene, p-chlorostyrene, and sodium styrenesulfonate), vinyl esters, acrylonitrile, methacrylonitrile, vinyl compounds having a nitrogen-containing heterocyclic ring, vinyl compounds containing a quaternary ammonium salt, N—N-vinylformamide, vinylsulfonic acid, vinylidene fluoride, vinyl alkyl ethers, and N-phenyl maleimide.

The content rate of the polyfunctional monomer in all the monomers is preferably from 0.5% to 70% by mass, and more preferably from 1.0% to 50% by mass.

The above monomers can be polymerized by radical polymerization. The monomers for preparing a gel electrolyte can be radical-polymerized by means of application of heat or exposure to light or electron beam, or electrochemically. In a case in which a cross-linked polymer is formed by application of heat, a polymerization initiator may be used. Specific preferred examples of the polymerization initiator include, but are not limited to, azo initiators such as 2,2'-azobisisobutyronitrile, 2,2'-azobis(2,4-dimethylvaleronitrile), and dimethyl-2,2'-azobis(2-methylpropionate); and peroxide initiators such as benzoyl peroxide. The addition amount of the polymerization initiator is preferably from 0.01% to 20% by mass, more preferably from 0.1% to 10% by mass, of the total amount of the monomers.

In a case in which gelation is performed by a cross-linking reaction of a polymer, it is preferable that the polymer has a cross-linkable reactive group and that a cross-linker is used in combination with the polymer. Specific preferred examples of the cross-linkable reactive group include, but are not limited to, nitrogen-containing heterocyclic rings such as pyridine, imidazole, thiazole, oxazole, triazole, morpholine, piperidine, and piperazine. Specific preferred examples pf the cross-linker include, but are not limited to, difunctional or higher functional reagents electrophilically reactive with nitrogen atom, such as alkyl halides, aralkyl halides, sulfonates, acid anhydrides, acid chlorides, and isocyanates.

Inorganic Hole Transport Layer

The charge transfer layer 7 may comprise an inorganic solid compound, in place of the electrolyte, to be an inorganic hole transport layer. In this case, the inorganic solid compound, such as copper iodide and copper thiocyanate, may be introduced into the inside of the electrode by means of casting, coating, spin coating, dipping, or electrolytic plating.

Organic Hole Transport Layer

Alternatively, the charge transfer layer 7 may comprise an organic hole transport material, in place of the electrolyte, to be an organic hole transport layer. The organic hole transport layer may have either a single-layer structure comprising a single material or a multi-layer structure comprising multiple types of materials. In the case of multi-layer structure, it is preferable that an organic hole transport layer closest to the second electrode 8 contains a polymeric material. By using the polymeric material having high film-forming performance, the surface of the porous electron transport layer can be smoothened and thereby photoelectric conversion property can be improved. In addition, because the polymeric material hardly permeates the porous electron transport layer, the surface of the porous electron transport layer can be sufficiently covered with the polymeric material and thereby the occurrence of short circuit is prevented and improved performance is provided.

Specific examples of the organic hole transport material used for the single-layer structure include, but are not limited to, oxadiazole compounds described in JP-34-5466-B; triphenylmethane compounds described in JP-45-555-B; pyrazoline compounds described in JP-52-4188-B; hydrazone compounds described in JP-55-42380-B; oxadiazole compounds described in JP-56-123544-A; tetraarylbenzidine compounds described in JP-54-58445-A; stilbene compounds described in JP-58-65440-A and JP-60-98437-A; and spiro-type compounds described in JP-11-513522-A. Among these compounds, tetraarylbenzidine compounds and spiro-type compounds are preferable.

Specific preferred examples of the organic hole transport material include a compound represented by the following formula (6).

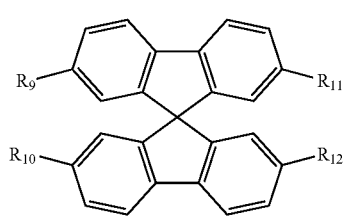

Formula (6)

In the formula (6), each of $R_9$ to $R_{12}$ independently represents an amino group.

Each of $R_9$ to $R_{12}$ may have a substituent. Specific examples of $R_9$ to $R_{12}$ include, but are not limited to, dimethylamino group, diphenylamino group, and naphthyl-4-tolylamino group.

Specific examples of the compound represented by the formula (6) include, but are not limited to, the following example compounds (D-1) to (D-20).

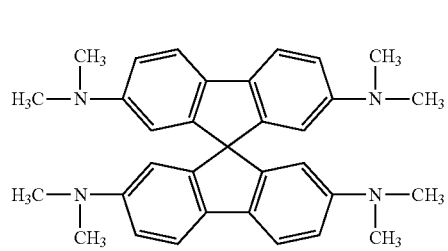

(D-1)

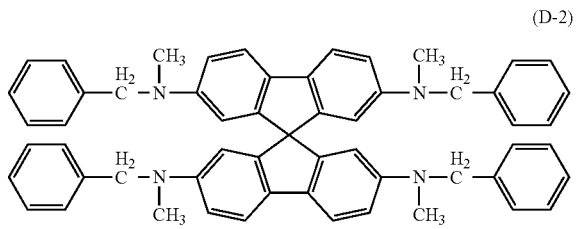

(D-2)

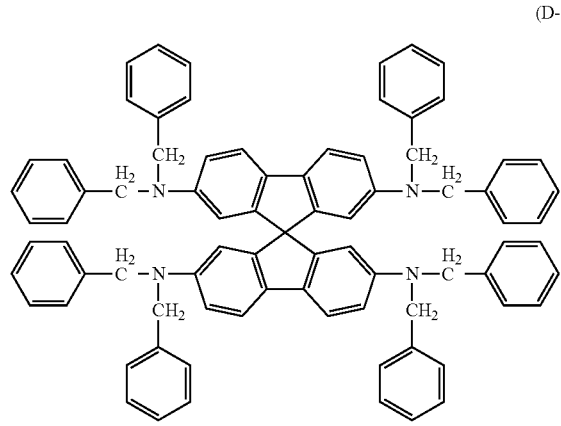

(D-3)

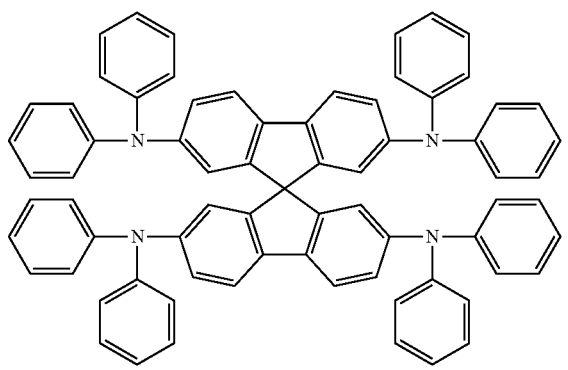

(D-4)

-continued
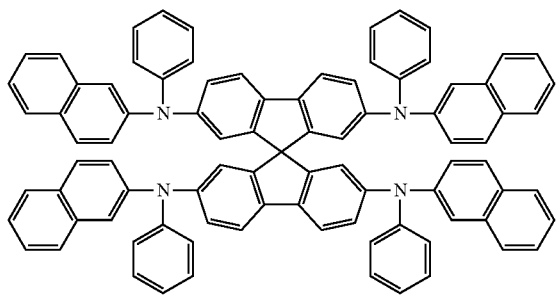
(D-5)
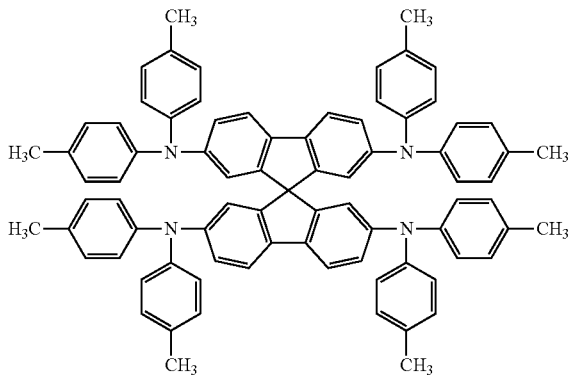
(D-6)
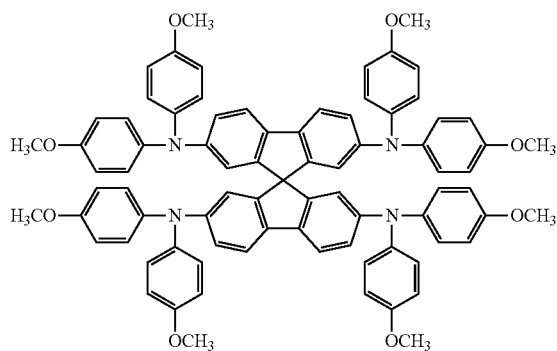
(D-7)
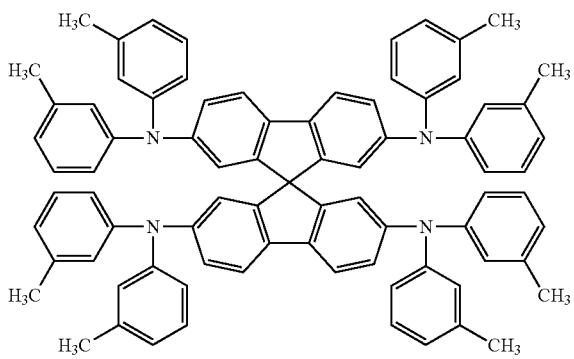
(D-8)
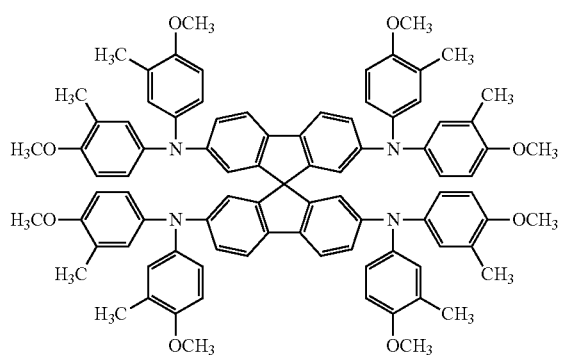
(D-9)
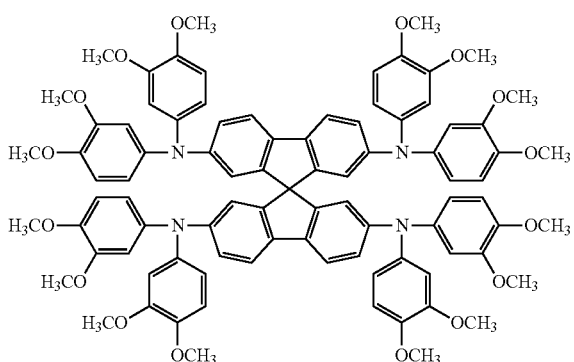
(D-10)
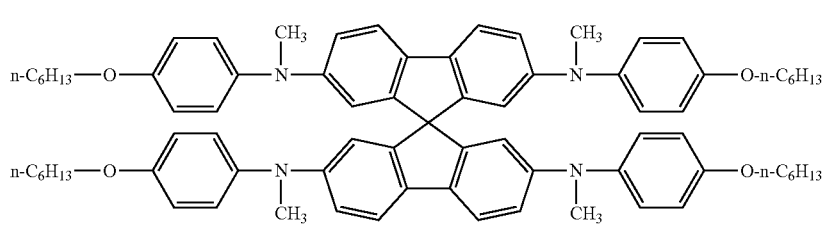
(D-11)

-continued
(D-12)
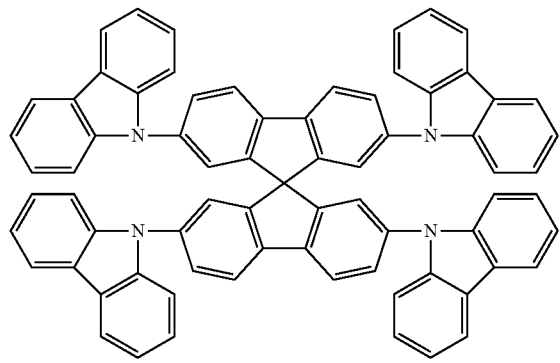
(D-13)
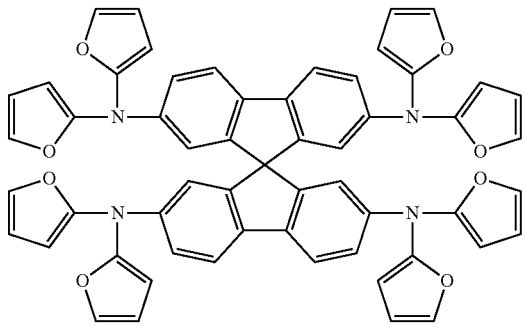
(D-14)
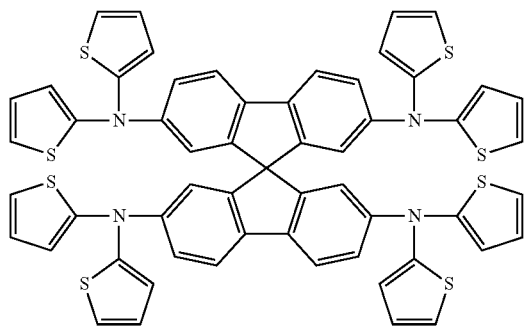
(D-15)
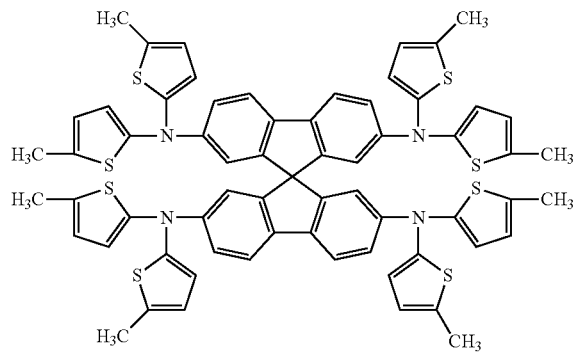
(D-16)
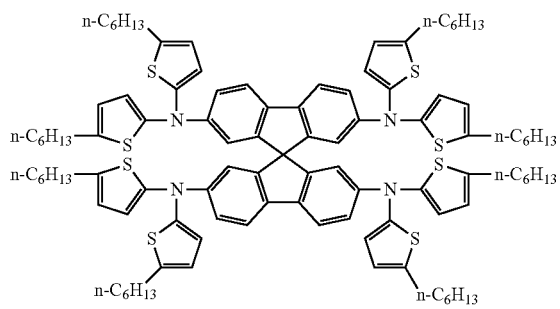
(D-17)
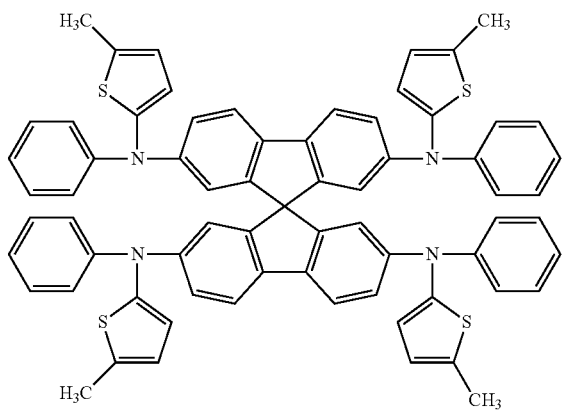
(D-18)
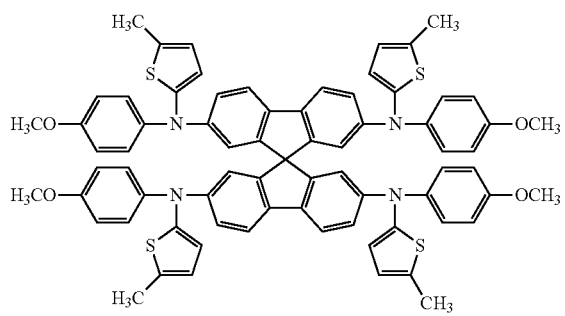
(D-19)
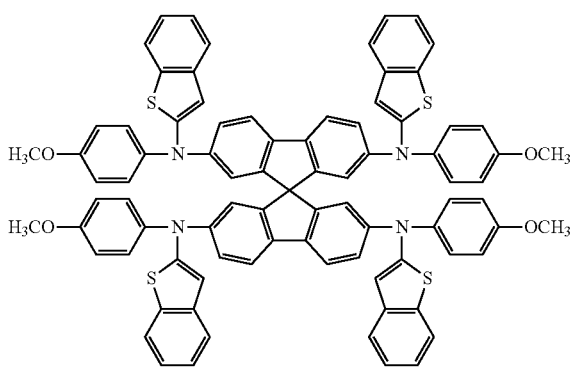

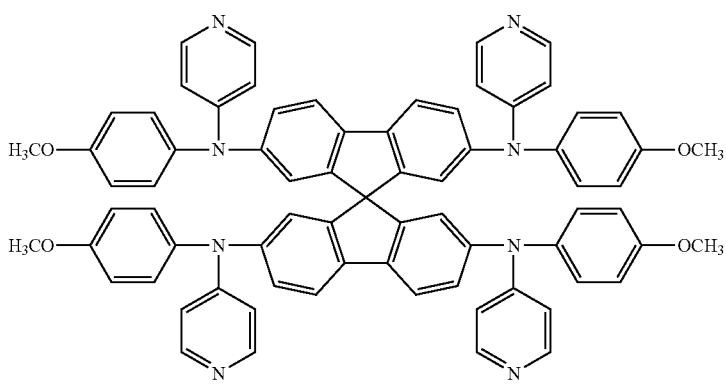

(D-20)

An additive may be further added to the organic hole transport material.

Specific examples of the additive include, but are not limited to, iodine; metal iodides such as lithium iodide, sodium iodide, potassium iodide, cesium iodide, calcium iodide, copper iodide, iron iodide, and silver iodide; iodine salts of quaternary ammonium compounds such as tetraalkylammonium iodide and pyridinium iodide; metal bromides such as lithium bromide, sodium bromide, potassium bromide, cesium bromide, and calcium bromide; bromine salts of quaternary ammonium compounds such as tetraalkylammonium bromide and pyridinium bromide; metal chlorides such as copper chloride and silver chloride; metal acetates such as copper acetate, silver acetate, and palladium acetate; metal sulfates such as copper sulfate and zinc sulfate; metal complexes such as ferrocyanate-ferricyanate and ferrocene-ferricinium ion; sulfur compounds such as sodium polysulfide and alkyl thiol-alkyl disulfide; viologen dye; hydroquinones; ionic liquids described in Inorg. Chem. 35 (1996) 1168 such as 1,2-dimethyl-3-n-propyl imidazolinium iodide, 1-methyl-3-n-hexyl imidazolinium iodide, 1,2-dimethyl-3-ethyl imidazolium trifluoromethane sulfonate, 1-methyl-3-butyl imidazolium nonafluorobutyl sulfonate, and 1-methyl-3-ethyl imidazolium bis(trifluoromethyl) sulfonylimide; basic compounds such as pyridine, 4-t-butyl pyridine, and benzimidazole; and lithium compounds such as lithium trifluoromethane sulfonylimide and lithium diisopropylimide.

For the purpose of improving conductivity, an oxidant may be added for converting a part of the organic hole transport material into radical cations. Specific examples of the oxidant include, but are not limited to, tris(4-bromophenyl)aminium hexachloroantimonate, silver hexafluoroantimonate, nitrosonium tetrafluoroborate, silver nitrate, cobalt complexes, and copper complexes. Not all the organic hole transport materials need to be oxidized by the oxidant and only a part of them may be oxidized. The oxidant having been added to the system may be either taken out or kept therein.

The hole transport layer may be formed with the inorganic or organic hole transport material directly on the electron transport layer 4 having the sensitizing dye on its surface. Such a solid hole transport layer is not limited in formation method and can be formed by, for example, a vacuum film-forming method (e.g., vacuum deposition) or a wet film-forming method. For reducing production cost, a wet film-forming method in which a coating liquid is applied onto the electron transport layer is preferable.

In wet film-forming methods, how to apply the paste is not particularly limited. For example, the coating liquid may be applied by means of dipping, spraying, wire bar, spin coating, roller coating, blade coating, gravure coating, or wet printing such as relief, offset, gravure, intaglio, rubber plate, and screen printings.

Alternatively, the layer may be formed in a supercritical fluid or a subcritical fluid.

The supercritical fluid is not limited in substance so long as it exists as a non-cohesive high-density fluid at temperatures and pressures beyond the region where gases and liquids can coexist (i.e., the critical point), without cohering even under compression, while having a temperature equal to or above the critical temperature and a pressure equal to or above the critical pressure. Specifically, those having a low critical temperature are preferable.

Specific examples of the supercritical fluid include, but are not limited to, carbon monoxide, carbon dioxide, ammonia, nitrogen, water, alcohol solvents (e.g., methanol, ethanol, and n-butanol), hydrocarbon solvents (e.g., ethane, propane, 2,3-dimethylbutane, benzene, and toluene), halogen solvents (e.g., methylene chloride and chlorotrifluoromethane), and ether solvents (e.g., dimethyl ether). Among these substances, carbon dioxide, having a supercritical pressure of 7.3 MPa and a supercritical temperature of 31° C., is preferable, because carbon dioxide is easy to put into a supercritical state and easy to handle owing to its non-combustibility.

Each of these fluids can be used alone or in combination with others.

The subcritical fluid is not limited in substance so long as it exists as a high-pressure liquid at temperatures and pressures near the critical point.

The above-described substances preferable for the supercritical fluid are also preferable for the subcritical fluid.

The supercritical fluid is not limited in critical temperature and critical pressure, but preferably has a critical temperature of from −273° C. to 300° C., more preferably from 0° C. to 200° C.

In addition, an organic solvent and/or entrainer can be used in combination with the supercritical fluid or subcritical fluid. Addition of an organic solvent and/or entrainer facilitates adjustment of solubility in the supercritical fluid.

Specific examples of the organic solvent include, but are not limited to, ketone solvents such as acetone, methyl ethyl ketone, and methyl isobutyl ketone; ester solvents such as ethyl formate, ethyl acetate, and n-butyl acetate; ether solvents such as diisopropyl ether, dimethoxyethane, tetrahydrofuran, dioxolan, and dioxane; amide solvents such as N,N-dimethylformamide, N,N-dimethylacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

After the hole transport material is provided on the electron transport layer 4 containing the electron transport material having the sensitizing dye on its surface, a press processing may be conducted. The press processing brings the hole transport material into a more intimate contact with the porous electrode, thus improving efficiency. The press processing may be a press molding using a flat plate such as an IR tablet pelletizer, or a roll press using a roller. The pressure in the press processing is preferably 10 kgf/cm$^2$ or more, and more preferably 30 kgf/cm$^2$ or more. The pressing time is preferably within 1 hour. Heat can be applied during the press processing, if necessary.

It is possible that a release material is interposed between the presser and the electrode in the press processing. Specific examples of the release material include, but are not limited to, fluorine resins such as polytetrafluoroethylene, polychlorotrifluoroethylene, tetrafluoroethylene-hexafluoropropylene copolymer, perfluoroalkoxyfluoro resin, polyvinylidene fluoride, ethylene-tetrafluoroethylene copolymer, ethylene-chlorotrifluoroethylene copolymer, and polyvinyl fluoride.

After the press processing and before provision of the second electrode 8, a metal oxide may be provided between the hole transport material and the second electrode 8. Specific examples of the metal oxide include, but are not limited to, molybdenum oxide, tungsten oxide, vanadium oxide, and nickel oxide. Among these materials, molybdenum oxide is preferable.

There is no limit on how to provide the metal oxide on the hole transport material. For example, a vacuum film-forming method, such as sputtering and vacuum deposition, and a wet film-forming method can be employed.

Specifically, a wet film-forming method in which a paste dispersing a powder or sol of a metal oxide is applied to the hole transport layer is preferable.

In this wet film-forming method, how to apply the coating liquid is not particularly limited. For example, the paste may be applied by means of dipping, spraying, wire bar, spin coating, roller coating, blade coating, gravure coating, or wet printing such as relief, offset, gravure, intaglio, rubber plate, and screen printings.

The film thickness of the charge transfer layer 7 is preferably from 0.1 to 50 nm and more preferably from 1 to 10 nm.

Second Electrode

There are roughly two methods for forming the charge transfer layer 7. One method includes bonding the second electrode 8 and the electron transport layer 4 having the sensitizing dye thereon to each other and thereafter interposing the charge transfer layer 7 in a liquid state therebetween. The other method includes directly applying the charge transfer layer 7 on the electron transport layer 4. In the latter case, the second electrode 8 is applied afterward.

In the former case, the charge transfer layer 7 may be interposed by a normal pressure process that uses capillary phenomenon caused by dipping, etc., or a vacuum process that replaces a gaseous phase with a liquid phase by reducing pressures. In the vacuum process, the second electrode 8 is applied while the charge transfer layer 7 remains undried and a measure against liquid leakage is provided at the edge portion. In a case in which the charge transfer layer 7 is a gel electrolyte, the charge transfer layer 7 is applied by a wet process and solidified thereafter by means of polymerization, etc. In this case, the second electrode 8 may be applied after the charge transfer layer 7 is dried and solidified.

The electrolytic solution, charge transfer material solution, and gel electrolyte may be applied in the same manner as semiconductor particles and sensitizing dyes, by means of dipping, roller, air knife, extrusion, slide hopper, wire bar, spinning, spraying, casting, and various printing methods.

The second electrode 8 may comprise a conductive substrate, similar to the first electrode 2. However, the substrate is not necessary so long as the strength and sealing performance are sufficiently secured.

Specific examples of usable materials for the second electrode 8 include, but are not limited to, metals such as platinum, gold, silver, copper, aluminum, rhodium, and indium; carbon; and conductive metal oxides such as ITO and FTO. The thickness of the second electrode 8 is not limited and can be appropriately changed.

In a case in which the charge transfer layer 7 contains the inorganic hole transport material or the organic hole transport material, the second electrode 8 is applied after the solid hole transport layer is formed or on the metal oxide described above. The second electrode 8 may have a similar configuration to the first electrode 2. However, the substrate is not necessary so long as the strength and sealing performance are sufficiently secured. Specific examples of usable materials for the second electrode 8 include, but are not limited to, metals such as platinum, gold, silver, copper, and aluminum; carbon compounds such as graphite, fullerene, and carbon nanotube; conductive metal oxides such as ITO and FTO; and conductive polymers such as polythiophene and polyaniline.

The second electrode 8 is not limited in thickness. The second electrode 8 may be formed of a single material or a mixture of two or more materials. The second electrode 8 can be formed on the hole transport layer by means of, for example, coating, lamination, vapor deposition, CVD (chemical vapor deposition), or bonding, depending on the types of materials constituting the second electrode 8 and the hole transport layer.

To function as a photoelectric conversion element, preferably, at least one of the first electrode 2 and the second electrode 8 is substantively transparent. In the present embodiment, preferably, the first electrode 2 is transparent to allow sunlight to enter from the first electrode 2 side. In this case, the second electrode 8 is preferably made of a light reflective material such as metal-deposited or conductive-oxide-deposited glass or plastic, or a metallic thin film. It is also effective to provide an antireflective layer on the solar light incoming side.

Absorption Wavelength Control Layer

The photoelectric conversion element may further include the absorption wavelength control layer 12. The absorption wavelength control layer 12 controls the light coming into the inside of the electrode for maintaining high power generating performance for an extended period of time. As illustrated in FIG. 3, the absorption wavelength control layer 12 is disposed on one side of the first electrode 2 opposite to the electron transport layer 4. Although the blocking layer 3 is illustrated in FIG. 3, the blocking layer 3 and the absorption wavelength control layer 12 do not need to be present at the same time but may exist separately.

Specific examples of the absorption wavelength control layer 12 include, but are not limited to, a wavelength blocking film and a filter. Preferably, the absorption wavelength control layer 12 exhibits a total light transmittance of 90% or more and a rate of blocking ultraviolet light having a wavelength of 385 nm or less of 99% or more.

By providing the absorption wavelength control layer 12, ultraviolet and near-ultraviolet light (from 250 to 350 nm) that less contributes to photoelectric conversion is excluded, and visible light (from 350 to 800 nm) that well contributes to photoelectric conversion is selectively incorporated into the inside of the electrode. Thus, the organic materials such as sensitizing dye and electrolyte are prevented from being deteriorated by light.

There are roughly two methods for forming the absorption wavelength control layer 12. One method includes directly bonding a wavelength blocking film having an adhesive layer to one surface of the substrate (or electrode) to which light enters. The other method includes bonding a wavelength blocking film or filter having no adhesive layer to a surface of the substrate (or electrode) via an adhesive.

In the former case, after the wavelength blocking film is bonded to the substrate, the wavelength blocking film is brought into intimate contact with the surface of the substrate by means of roller or presser.

In the latter case, the wavelength blocking film or filter is adhered to the surface of the substrate via a photocurable resin that is curable under light having a wavelength out of the wavelength blocking range or a two-liquid-mixing curable resin requiring no light when curing. These resins preferably exhibit a high total light transmittance after being cured.

Frame Structure

The photoelectric conversion element may have a frame structure that is formed via a pin header serving as an electrode terminal extraction section.

In a case in which the electrode is a transparent conductive film formed on a glass plate, the electrode terminal may cause connection failure because of having high smoothness and difficulty in soldering. By contrast, the frame structure improves connectivity of the electrode terminal of the photoelectric conversion element, so that high conversion efficiency can be maintained for an extended period of time.

In the present embodiment, the frame structure is formed by connecting the first electrode 2 and the pin header to each other. There are two types of frame structures that connect the first electrode 2 and the pin header to each other. According to the first type, the pin header itself has a force for pinching the glass substrate. According to the second type, the pin header and the transparent conductive film are brought into intimate contact by an external force.

In the former case, it is preferable that the connection length is sufficient for securing the pinching force. Specific examples of connecting components include, for example, a clip terminal (537-0.7 available from WAKO Corporation Limited).

In the latter case, the transparent conductive film and the pin header are connected via an elastic member, such as a rubber connector, by a physical stress. Specifically, the transparent conductive film and the pin header may be fixed to each other by screwing with a resin frame (e.g., polycarbonate) or ultrasonic welding while maintaining the physical stress. In the case of ultrasonic welding, ultrasonic welding conditions capable of resin-welding practically used in the automobile field may be applied.

FIG. 4A is a cross-sectional view of a photoelectric conversion element having a flame structure. FIG. 4B is a schematic view of a light receiving section in the photoelectric conversion element illustrated in FIG. 4A. Referring to FIGS. 4A and 4B, a photoelectric conversion element 20 is sealed by a cover glass 22 with a sealing resin 24. An extraction electrode 23 is also sealed. The frame structure is formed by disposing a polycarbonate resin 27, a carbon rubber 25, and a metal pin 26 in the manner illustrated in FIG. 4A. A numeral 21 denotes the substrate 1 or the first electrode 2.

Use Application

The photoelectric conversion element in accordance with some embodiments of the present invention is applicable to solar cells and power supply devices using the solar cells. The photoelectric conversion element is also applicable to devices using conventional solar cells or power supply device using the solar cells. For example, the photoelectric conversion element can be applied to solar cells used in electronic desk calculators and wristwatches. In particular, the photoelectric conversion element in accordance with some embodiments of the present invention can be advantageously applied to power supply devices used in cell phones, electronic organizers, electronic papers, etc. In addition, the photoelectric conversion element can also be used as an auxiliary power supply for lengthening continuous operating time of charging-type or battery-type electronic devices.

EXAMPLES

Further understanding can be obtained by reference to certain specific examples which are provided herein for the purpose of illustration only and are not intended to be limiting.

Example 1

Preparation of Electron Transport Layer 4

First, 2 ml of titanium tetra-n-propoxide, 4 ml of acetic acid, 1 ml of ion-exchange water, and 40 ml of 2-propanol were mixed. The mixture liquid was applied onto a FTO glass substrate (first electrode 2) by spin coating, dried at room temperature, and burnt in the air at 450° C. for 30 minutes. The same mixture liquid was reapplied onto the first electrode 2 by spin coating to have a film thickness of 100 nm and thereafter burnt in the air at 450° C. for 30 minutes. Thus, a blocking layer 3 was formed.

Next, 3.0 g of titanium oxide (P-25 available from Nippon Aerosil Co., Ltd.) and 0.3 g of acetylacetone were subjected to a bead mill treatment, along with 5.5 g of water and 1.2 g of ethanol, for 12 hours. The resulting dispersion liquid was mixed with 0.3 g of a surfactant (polyoxyethylene octyl phenyl ether, available from Wako Pure Chemical Industries, Ltd.) and 1.2 g of a polyethylene glycol (#20,000) to prepare a paste. The paste was applied onto the blocking layer 3 to have a film thickness of 2.0 μm, dried at room temperature, and then burnt in the air at 500° C. for 30 minutes. Thus, a porous titanium oxide semiconductor electrode was prepared.

The above-prepared titanium oxide semiconductor electrode was immersed in a 2-ethoxyethanol solution of 0.5 mM of the example compound (sensitizing dye) (B-5) and 1.0 mM of the example compound (co-adsorbent) (C-12) (this solution may be hereinafter "dye solution") and left to stand at room temperature for 1 hour in a dark place so that the sensitizing dye was adsorbed thereto. Thus, an electron transport layer 4 was formed.

Preparation and Evaluation of Photoelectric Conversion Element

The electron transport layer 4 was coated with a chlorobenzene solution of 0.1 M of the example compound (D-7), 27 mM of trifluoromethanesulfonylimide lithium, and 0.11 M of 4-t-butylpyridine by spin coating and naturally dried. Thus, a charge transfer layer 7 was formed. Further, a silver film having a thickness of about 100 nm was formed thereon by vacuum vapor deposition to form a second electrode 8. Thus, a photoelectric conversion element was prepared.

The photoelectric conversion element was irradiated with pseudo sunlight emitted from a solar simulator (AM1.5, 100 mW/cm$^2$) from the first electrode 2 side to evaluate solar cell characteristics. As a result, the open voltage was 0.91 V, the short-circuit current density was 6.70 mA/cm$^2$, the shape factor was 0.64, and the conversion efficiency was 3.90%, which are good values.

Examples 2 to 8

The procedure in Example 1 was repeated except for replacing the co-adsorbent (C-12) with other one as described in Table 1. The results are shown in Table 1.

TABLE 1

| | Sensitizing Dye | Co-adsorbent | Organic Hole Transport Material | Open Voltage (V) | Short-circuit Current Density (mA/cm$^2$) | Shape Factor | Conversion Efficiency (%) |
|---|---|---|---|---|---|---|---|
| Example 1 | B-5 | C-12 | D-7 | 0.91 | 6.70 | 0.64 | 3.90 |
| Example 2 | B-5 | C-3  | D-7 | 0.89 | 6.42 | 0.65 | 3.71 |
| Example 3 | B-5 | C-13 | D-7 | 0.92 | 6.81 | 0.65 | 4.07 |
| Example 4 | B-5 | C-16 | D-7 | 0.91 | 6.97 | 0.64 | 4.06 |
| Example 5 | B-5 | C-22 | D-7 | 0.90 | 6.84 | 0.65 | 4.00 |
| Example 6 | B-5 | C-28 | D-7 | 0.91 | 6.77 | 0.65 | 4.00 |
| Example 7 | B-5 | C-33 | D-7 | 0.90 | 6.44 | 0.63 | 3.65 |
| Example 8 | B-5 | C-53 | D-7 | 0.90 | 6.58 | 0.62 | 3.67 |

All the photoelectric conversion elements of Examples 1 to 8 have good conversion efficiency. In particular, those using the co-adsorbent (C-12), (C-13), (C-16), (C-22), or (C-28), each of which having a hydrocarbon-based aromatic ring to which an alkoxy group is introduced, have the best properties. Those using the co-adsorbent having thiophene ring to which an alkyl group is introduced and those using the co-adsorbent having a hydrocarbon-based aromatic ring to which a phenoxy group is introduced have the second best properties.

Examples 9 to 16

The above-prepared photoelectric conversion elements were subjected to a durability test. In the durability test, each of the photoelectric conversion elements prepared in Examples 1 to 8, the outer periphery of which had been sealed with an epoxy resin and glass, was put in an oven heated at 60° C. for 100 hours and thereafter subjected to an evaluation of photoelectric conversion element properties. The results are shown in Table 2. In each Example, the ratio of the conversion efficiency after the durability test to the initial value is 95% or higher, which means that durability is good.

TABLE 2

| | Sensitizing Dye | Co-adsorbent | Organic Hole Transport Material | Open Voltage (V) | Short-circuit Current Density (mA/cm²) | Shape Factor | Conversion Efficiency after Durability Test (%) | Ratio to Initial Value (%) |
|---|---|---|---|---|---|---|---|---|
| Example 9  | B-5 | C-12 | D-7 | 0.91 | 6.62 | 0.64 | 3.86 | 99.0 |
| Example 10 | B-5 | C-3  | D-7 | 0.89 | 6.35 | 0.64 | 3.62 | 97.6 |
| Example 11 | B-5 | C-13 | D-7 | 0.92 | 6.70 | 0.64 | 3.94 | 96.8 |
| Example 12 | B-5 | C-16 | D-7 | 0.91 | 6.85 | 0.64 | 3.99 | 98.3 |
| Example 13 | B-5 | C-22 | D-7 | 0.90 | 6.62 | 0.65 | 3.87 | 96.8 |
| Example 14 | B-5 | C-28 | D-7 | 0.91 | 6.63 | 0.65 | 3.92 | 98.0 |
| Example 15 | B-5 | C-33 | D-7 | 0.90 | 6.30 | 0.63 | 3.57 | 97.8 |
| Example 16 | B-5 | C-53 | D-7 | 0.90 | 6.44 | 0.62 | 3.59 | 97.8 |

Comparative Examples 1 to 9

The procedure in Example 1 was repeated except for replacing the co-adsorbent (C-12) with other one as described in Table 3. The results are shown in Table 3.

TABLE 3

| | Sensitizing Dye | Co-adsorbent | Organic Hole Transport Material | Open Voltage (V) | Short-circuit Current Density (mA/cm²) | Shape Factor | Conversion Efficiency (%) |
|---|---|---|---|---|---|---|---|
| Comparative Example 1 | B-5 | 4-Dimethylaminobenzoic acid | D-7 | 0.82 | 5.13 | 0.57 | 2.40 |
| Comparative Example 2 | B-5 | 4-Cyanobenzoic acid | D-7 | 0.87 | 4.29 | 0.61 | 2.28 |
| Comparative Example 3 | B-5 | 4-Bromobenzoic acid | D-7 | 0.86 | 4.07 | 0.60 | 2.10 |
| Comparative Example 4 | B-5 | Cholic acid | D-7 | 0.82 | 6.02 | 0.60 | 2.96 |
| Comparative Example 5 | B-5 | Chenodeoxycholic acid | D-7 | 0.81 | 5.97 | 0.61 | 2.95 |
| Comparative Example 6 | B-5 | n-Decylsulfonic acid | D-7 | 0.91 | 0.74 | 0.44 | 0.30 |
| Comparative Example 7 | B-5 | Phenylsulfonic acid | D-7 | 0.90 | 1.28 | 0.55 | 0.63 |
| Comparative Example 8 | B-5 | Benzenesulfonic acid | D-7 | 0.24 | 2.08 | 0.34 | 0.17 |
| Comparative Example 9 | B-5 | 3-Phenylpropionic acid | D-7 | 0.55 | 2.49 | 0.52 | 0.71 |

It is clear from comparison between Examples 1 to 8 and Comparative Examples 1 to 3 that, among benzoic acid derivatives, those having a strong electron donating group at the p-position (such as 4-dimethylaminobenzoic acid) and those having a strong electron withdrawing group at the p-position (such as 4-cyanobenzoic acid and 4-bromobenzoic acid) have inferior properties. The reason is considered that the carboxylic acid in each compound has a different acidity and exerts some influence.

It is clear from comparison between Comparative Examples 4 and 5 that, when cholic acid or chenodeoxycholic acid is used, the initial conversion efficiency is relatively good. However, since these compounds do not absorb ultraviolet light, it is difficult to manage the solutions thereof using HPLC. If the solutions of these compounds are used continuously, it will be possible to quantify the dye but difficult to quantify the co-adsorbent.

It is clear from Comparative Examples 6 to 8 that, when phosphonic acid or sulfonic acid is used, the initial property is very poor. The reason is considered that the acidity of phosphonic acid or sulfonic acid is excessively stronger than that of the carboxylic acids used in Examples.

It is clear from Comparative Example 9 that, when 3-phenylpropionic acid that has an alkyl group and benzene ring is used, properties are poor. This is because the acidity of carboxylic acid is different since the alkyl group is bound to the carboxylic acid.

Comparative Examples 10 to 18

Each of the photoelectric conversion elements prepared in Comparative Examples 1 to 9, the outer periphery of which had been sealed with an epoxy resin and glass, was put in an oven heated at 60° C. for 100 hours, to be subjected to the same durability test as in Examples 9 to 16. The results are shown in Table 4. In each Comparative Example, the ratio of the conversion efficiency after the durability test to the initial value is 60% or less, which means that durability is inferior to that in Examples.

TABLE 4

| | Sensitizing Dye | Co-adsorbent | Organic Hole Transport Material | Open Voltage (V) | Short-circuit Current Density (mA/cm²) | Shape Factor | Conversion Efficiency after Durability Test (%) | Ratio to Initial Value (%) |
|---|---|---|---|---|---|---|---|---|
| Comparative Example 10 | B-5 | 4-Dimethylaminobenzoic acid | D-7 | 0.77 | 3.29 | 0.50 | 1.27 | 52.9 |
| Comparative Example 11 | B-5 | 4-Cyanobenzoic acid | D-7 | 0.79 | 2.84 | 0.51 | 1.14 | 50.0 |
| Comparative Example 12 | B-5 | 4-Bromobenzoic acid | D-7 | 0.80 | 2.26 | 0.52 | 0.94 | 44.8 |
| Comparative Example 13 | B-5 | Cholic acid | D-7 | 0.79 | 3.81 | 0.35 | 1.05 | 35.5 |
| Comparative Example 14 | B-5 | Chenodeoxycholic acid | D-7 | 0.77 | 2.96 | 0.33 | 0.75 | 25.4 |
| Comparative Example 15 | B-5 | n-Decylsulfonic acid | D-7 | 0.90 | 0.21 | 0.46 | 0.09 | 30.0 |
| Comparative Example 16 | B-5 | Phenylsulfonic acid | D-7 | 0.88 | 0.14 | 0.44 | 0.05 | 7.9 |
| Comparative Example 17 | B-5 | Benzenesulfonic acid | D-7 | 0.19 | 0.94 | 0.25 | 0.04 | 23.5 |
| Comparative Example 18 | B-5 | 3-Phenylpropionic acid | D-7 | 0.45 | 2.07 | 0.42 | 0.39 | 54.9 |

Comparative Example 19

The procedure in Example 1 was repeated except for replacing the sensitizing dye (B-5) with the following compound (E-1). As a result, the open voltage was 0.90 V, the short-circuit current density was 6.81 mA/cm², the shape factor was 0.62, and the conversion efficiency was 3.80%, which are good values.

After the outer periphery had been sealed with an epoxy resin and glass, the above-prepared photoelectric conversion element was put in an oven heated at 60° C. for 100 hours, to be subjected to the same durability test as in Examples 9 to 16. As a result, the open voltage was 0.68 V, the short-circuit current density was 3.17 mA/cm², the shape factor was 0.51, and the conversion efficiency was 1.10%. The ratio of the conversion efficiency after the durability test to the initial value is 28.9%, which means that durability is inferior to that in Examples. The results are shown in Table 5.

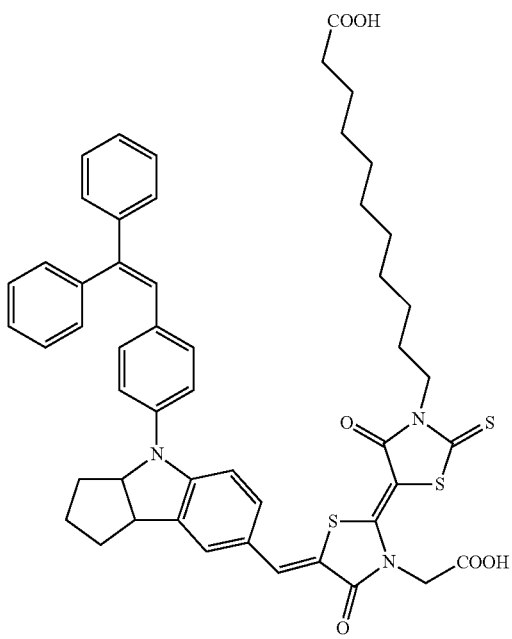

(E-1)

Comparative Example 20

The procedure in Example 1 was repeated except for replacing the sensitizing dye (B-5) with the following compound (E-2). As a result, the open voltage was 0.93 V, the short-circuit current density was 4.89 mA/cm², the shape factor was 0.63, and the conversion efficiency was 2.87%, which are relatively good values.

After the outer periphery had been sealed with an epoxy resin and glass, the above-prepared photoelectric conversion element was put in an oven heated at 60° C. for 100 hours, to be subjected to the same durability test as in Examples 9 to 16. As a result, the open voltage was 0.77 V, the short-circuit current density was 3.44 mA/cm², the shape factor was 0.59, and the conversion efficiency was 1.56%. The ratio of the conversion efficiency after the durability test to the initial value is 54.3%, which means that durability is inferior to that in Examples. The results are shown in Table 5.

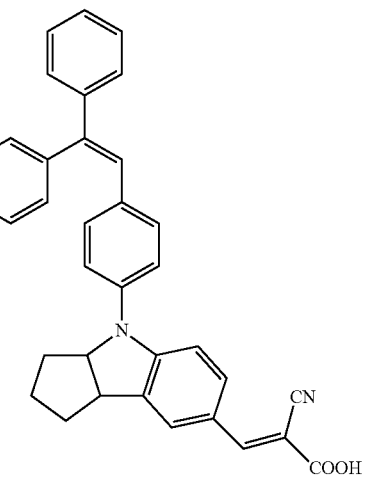

(E-2)

Comparative Example 21

The procedure in Example 1 was repeated except for replacing the sensitizing dye (B-5) with the following compound (E-3). As a result, the open voltage was 0.77 V, the short-circuit current density was 2.59 mA/cm², the shape factor was 0.60, and the conversion efficiency was 1.20%. The conversion efficiency was lower than that in Examples.

After the outer periphery had been sealed with an epoxy resin and glass, the above-prepared photoelectric conversion element was put in an oven heated at 60° C. for 100 hours, to be subjected to the same durability test as in Examples 9 to 16. As a result, the open voltage was 0.62 V, the short-circuit current density was 3.07 mA/cm², the shape factor was 0.51, and the conversion efficiency was 0.97%. The ratio of the conversion efficiency after the durability test to the initial value is 80.8%, which means that durability is relatively good. However, with the above combination, the initial conversion efficiency is lower than (inferior to) that in Examples. The results are shown in Table 5.

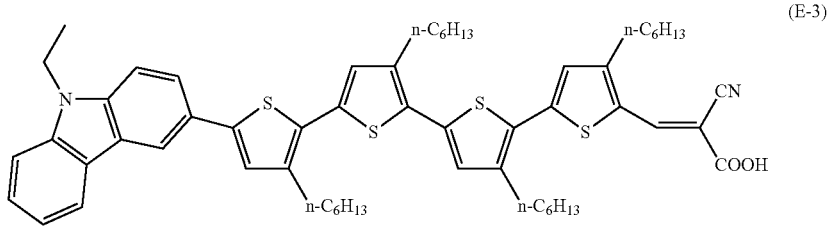

Comparative Example 22

The procedure in Example 1 was repeated except for replacing the co-adsorbent (C-12) with the compound (E-2). As a result, the open voltage was 0.87 V, the short-circuit current density was 4.55 mA/cm², the shape factor was 0.60, and the conversion efficiency was 2.38%. The conversion efficiency was lower than that in Example 1. Although the sensitizing dye (E-2) was used as a substitute for the co-adsorbent, no effect as the co-adsorbent was exerted, resulting in poor properties of the photoelectric conversion element. The results are shown in Table 5.

Example 17

The dye solution used in Example 1 was subjected to a HPLC measurement under the following conditions.

Figure 5:
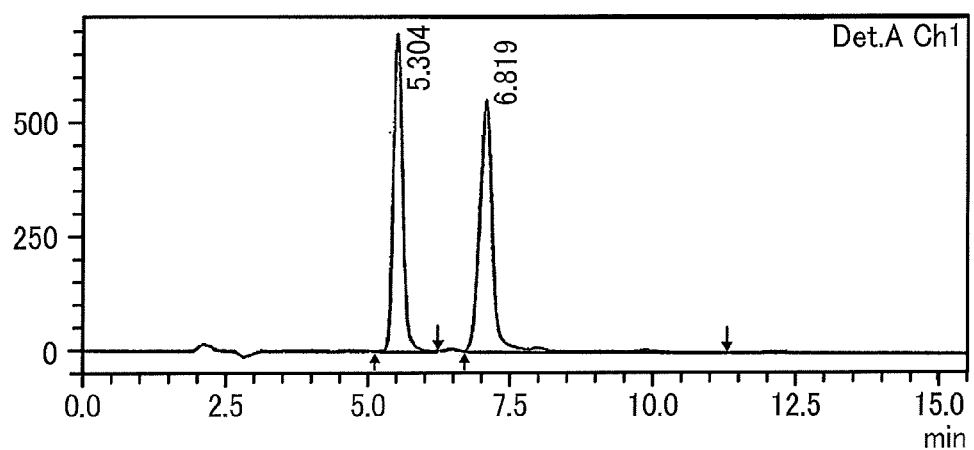
FIG. 5 is a HPLC chart of a dye solution used in Example 1.

HPLC instrument: LC-2010A available from Shimadzu Corporation
Column: INTERSIL ODS-3 available from GL Sciences Inc.
Eluent: THF/water=65/35
Detection wavelength: 254 nm The result is shown in FIG. 5. Referring to FIG. 5, the sensitizing dye and the co-adsorbent were detected as peaks at about 6.8 minutes and 5.3 minutes, respectively.

Comparative Example 23

The dye solution used in Comparative Example 5 was subjected to a HPLC measurement under the same conditions as in Example 17. The result is shown in FIG. 6.

Figure 6:
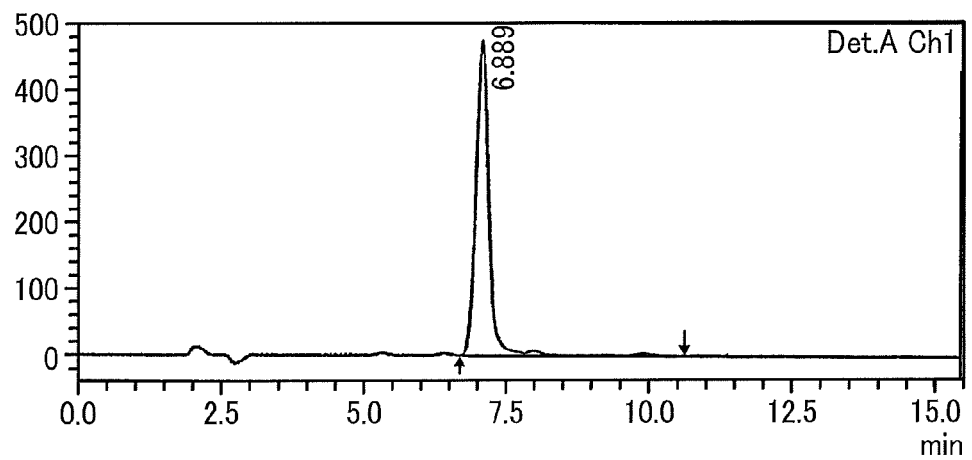
FIG. 6 is a HPLC chart of a dye solution used in Comparative Example 5.

Referring to FIG. 6, the sensitizing dye was detected at about 6.9 minutes but chenodeoxycholic acid serving as the chenodeoxycholic acid was not detected.

It is clear from Example 17 and Comparative Example 23 that the concentration can be easily managed by HPLC measurement.

Example 18

The procedure in Example 1 was repeated except for changing the concentration of the co-adsorbent (C-12) from 1.0 mM to 0.5 mM. As a result, the open voltage was 0.90 V, the short-circuit current density was 6.44 mA/cm², the shape factor was 0.64, and the conversion efficiency was 3.71%, which are good values. The results are shown in Table 6.

TABLE 5

| | Sensitizing Dye | Co-adsorbent | Organic Hole Transport Material | Open Voltage (V) | Short-circuit Current Density (mA/cm²) | Shape Factor | Conversion Efficiency after Durability Test (%) | Ratio to Initial Value (%) |
|---|---|---|---|---|---|---|---|---|
| Comparative Example 19 | E-1 | C-12 | D-7 | 0.90 | 6.81 | 0.62 | 3.80 | 28.9 |
| | | | | 0.68 | 3.17 | 0.51 | 1.10 | |
| Comparative Example 20 | E-2 | C-12 | D-7 | 0.93 | 4.89 | 0.63 | 2.87 | 54.3 |
| | | | | 0.77 | 3.44 | 0.59 | 1.56 | |
| Comparative Example 21 | E-3 | C-12 | D-7 | 0.77 | 2.59 | 0.60 | 1.20 | 80.8 |
| | | | | 0.62 | 3.07 | 0.51 | 0.97 | |
| Comparative Example 22 | B-5 | E-2 | D-7 | 0.87 | 4.55 | 0.60 | 2.38 | — |

In Table 5, the upper and lower columns for each of Comparative Examples 19 to 21 respectively show initial values and values after the durability test.

It is clear from Comparative Examples 19 to 21 that, even when the example compound (C-12) is used, the durability test result is poor when the sensitizing dye is different.

Example 19

The procedure in Example 1 was repeated except for changing the concentration of the co-adsorbent (C-12) from 1.0 mM to 1.5 mM. As a result, the open voltage was 0.90 V, the short-circuit current density was 6.91 mA/cm², the shape factor was 0.64, and the conversion efficiency was 3.98%, which are good values. The results are shown in Table 6.

Example 20

The procedure in Example 1 was repeated except for changing the concentration of the co-adsorbent (C-12) from 1.0 mM to 3.0 mM. As a result, the open voltage was 0.89 V, the short-circuit current density was 6.02 mA/cm², the shape factor was 0.63, and the conversion efficiency was 3.38%, which are good values. The results are shown in Table 6.

Example 21

The procedure in Example 1 was repeated except for replacing the 2-ethoxyethanol with 3-methoxypropionitrile. As a result, the open voltage was 0.91 V, the short-circuit current density was 7.02 mA/cm², the shape factor was 0.63, and the conversion efficiency was 4.02%, which are good values. The results are shown in Table 6.

Example 22

The procedure in Example 1 was repeated except for replacing the 2-ethoxyethanol with a mixture liquid of 2-methoxyethanol and 3-methoxypropionitrile (volume ratio=1:1). As a result, the open voltage was 0.90 V, the short-circuit current density was 6.79 mA/cm², the shape factor was 0.64, and the conversion efficiency was 3.91%, which are good values. The results are shown in Table 6.

Example 23

The procedure in Example 1 was repeated except for replacing the 2-ethoxyethanol with a mixture liquid of t-butanol and acetonitrile (volume ratio=1:1). As a result, the open voltage was 0.90 V, the short-circuit current density was 6.71 mA/cm², the shape factor was 0.63, and the conversion efficiency was 3.80%, which are good values. The results are shown in Table 6.

Example 24

The procedure in Example 1 was repeated except for replacing the 2-ethoxyethanol with diethylene glycol dimethyl ether. As a result, the open voltage was 0.88 V, the short-circuit current density was 6.99 mA/cm², the shape factor was 0.62, and the conversion efficiency was 3.81%, which are good values. The results are shown in Table 6.

Example 25

The procedure in Example 1 was repeated except for changing the temperature and time conditions for adsorbing the sensitizing dye from "at room temperature for 1 hour" to "in an oven heated to 60° C. for 15 minutes". As a result, the open voltage was 0.90 V, the short-circuit current density was 6.80 mA/cm², the shape factor was 0.64, and the conversion efficiency was 3.92%, which are good values. The results are shown in Table 6.

Example 26

The procedure in Example 1 was repeated except for changing the temperature and time conditions for adsorbing the sensitizing dye from "at room temperature for 1 hour" to "at room temperature for 2 hours". As a result, the open voltage was 0.91 V, the short-circuit current density was 6.70 mA/cm², the shape factor was 0.64, and the conversion efficiency was 3.90%, which are good values. The results are shown in Table 6.

Example 27

The procedure in Example 1 was repeated except for replacing the example compound (D-7) with the following compound (E-4). As a result, the open voltage was 0.91 V, the short-circuit current density was 6.20 mA/cm², the shape factor was 0.61, and the conversion efficiency was 3.44%, which are good values, although the efficiency is slightly lower than that of Example 1.

After the outer periphery had been sealed with an epoxy resin and glass, the above-prepared photoelectric conversion element was put in an oven heated at 60° C. for 100 hours. As a result, the open voltage was 0.91 V, the short-circuit current density was 6.06 mA/cm², the shape factor was 0.61, and the conversion efficiency was 3.36%. The ratio of the conversion efficiency after the durability test to the initial value is 97.7%, which means that durability is good. The results are shown in Table 6.

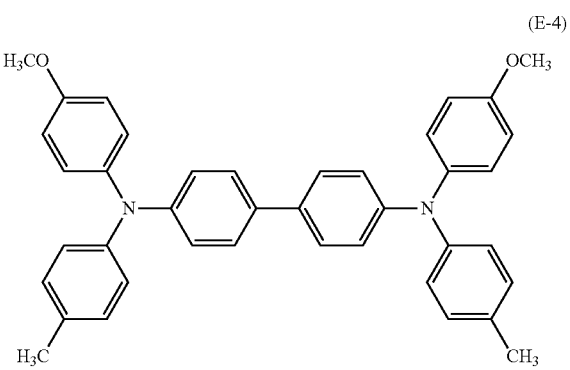 [SMILES: COc1ccc(N(c2ccc(C)cc2)c2ccc(-c3ccc(N(c4ccc(C)cc4)c4ccc(OC)cc4)cc3)cc2)cc1]

(E-4)

TABLE 6

| | Sensitizing Dye | Co-adsorbent | Solvent | Concentration of Co-adsorbent (mM) | Sensitizing Dye Adsorption Condition Room temp. | Organic Hole Transport Material | Open Voltage (V) | Short-circuit Current Density (mA/cm$^2$) | Shape Factor | Conversion Efficiency (%) |
|---|---|---|---|---|---|---|---|---|---|---|
| Example 18 | B-5 | C-12 | 2-Ethoxyethanol | 0.5 | Room temp. 1 hour | D-7 | 0.90 | 6.44 | 0.64 | 3.71 |
| Example 19 | B-5 | C-12 | 2-Ethoxyethanol | 1.5 | Room temp. 1 hour | D-7 | 0.90 | 6.91 | 0.64 | 3.98 |
| Example 20 | B-5 | C-12 | 2-Ethoxyethanol | 3.0 | Room temp. 1 hour | D-7 | 0.89 | 6.02 | 0.63 | 3.38 |
| Example 21 | B-5 | C-12 | 3-Methoxypropionitrile | 1.0 | Room temp. 1 hour | D-7 | 0.91 | 7.02 | 0.63 | 4.02 |
| Example 22 | B-5 | C-12 | 2-Methoxyethanol & 3-Methoxypropionitrile | 1.0 | Room temp. 1 hour | D-7 | 0.90 | 6.79 | 0.64 | 3.91 |
| Example 23 | B-5 | C-12 | t-Butanol & Acetonitrile | 1.0 | Room temp. 1 hour | D-7 | 0.90 | 6.71 | 0.63 | 3.80 |
| Example 24 | B-5 | C-12 | Diethylene glycol dimethyl ether | 1.0 | Room temp. 1 hour | D-7 | 0.88 | 6.99 | 0.62 | 3.81 |
| Example 25 | B-5 | C-12 | 2-Ethoxyethanol | 1.0 | 60° C. 15 min. | D-7 | 0.90 | 6.80 | 0.64 | 3.92 |
| Example 26 | B-5 | C-12 | 2-Ethoxyethanol | 1.0 | Room temp. 2 hours | D-7 | 0.91 | 6.70 | 0.64 | 3.90 |
| Example 27 | B-5 | C-12 | 2-Ethoxyethanol | 1.0 | Room temp. 1 hour | E-4 | 0.91 0.91 | 6.20 6.06 | 0.61 0.61 | 3.44 3.36 |

It is clear from Example 1 and Examples 18 to 20 that, when the concentration of the co-adsorbent is from 0.5 to 1.5 mM, when the concentration of the sensitizing dye is 0.5 mM, the properties are very good. When the concentration of the co-adsorbent is 3.0 mM, the properties are also good, although slightly lower than those when the concentration of the co-adsorbent is from 0.5 to 1.5 mM.

It is clear from Example 1 and Examples 21 to 24 that each of the various organic solvents used therein deliver good properties.

It is clear from Example 1 and Examples 25 to 26 that each of the various temperature and time conditions for adsorbing the sensitizing dye employed therein deliver good properties.

Examples 28 to 31

The procedure in Example 1 was repeated except for replacing 0.5 mM of the sensitizing dye (B-5) with other one described in Table 7. The results are shown in Table 7.

TABLE 7

| | Sensitizing Dye | Co-adsorbent | Organic Hole Transport Material | Open Voltage (V) | Short-circuit Current Density (mA/cm$^2$) | Shape Factor | Conversion Efficiency (%) |
|---|---|---|---|---|---|---|---|
| Example 28 | B-6 | C-12 | D-7 | 0.90 | 6.72 | 0.64 | 3.87 |
| Example 29 | B-13 | C-12 | D-7 | 0.88 | 6.59 | 0.63 | 3.65 |
| Example 30 | B-19 | C-12 | D-7 | 0.88 | 6.49 | 0.62 | 3.54 |
| Example 31 | B-21 | C-12 | D-7 | 0.90 | 6.80 | 0.64 | 3.92 |

Example 1 and Examples 28 to 31 all have good conversion efficiency. Compared to the case in which the sensitizing dye (B-5) is used, the conversion efficiency is almost same when the example compound (B-6) or (B-21) is used and is slightly lower when the example compound (B-13) or (B-19) is used.

Example 32

The procedure in Example 1 was repeated except for replacing the example compound (B-5) with the example compound (B-37). As a result, the open voltage was 0.95 V, the short-circuit current density was 6.85 mA/cm$^2$, the shape factor was 0.67, and the conversion efficiency was 4.36%, which are good values.

Example 33

After the outer periphery had been sealed with an epoxy resin and glass, the photoelectric conversion element prepared in Example 32 was put in an oven heated at 60° C. for 100 hours. As a result, the open voltage was 0.93 V, the short-circuit current density was 6.92 mA/cm$^2$, the shape factor was 0.66, and the conversion efficiency was 4.24%, which are good values. The ratio of the conversion efficiency after the durability test to the initial value is 97%, which means that durability is good.

Example 34

The procedure in Example 1 was repeated except for replacing the example compound (B-5) with the example compound (B-38). As a result, the open voltage was 0.94 V, the short-circuit current density was 6.92 mA/cm², the shape factor was 0.66, and the conversion efficiency was 4.29%, which are good values.

Example 35

After the outer periphery had been sealed with an epoxy resin and glass, the photoelectric conversion element prepared in Example 34 was put in an oven heated at 60° C. for 100 hours. As a result, the open voltage was 0.92 V, the short-circuit current density was 7.15 mA/cm², the shape factor was 0.65, and the conversion efficiency was 4.27%, which are good values. The ratio of the conversion efficiency after the durability test to the initial value is 99%, which means that durability is good.

Comparative Example 24

The procedure in Example 32 was repeated except for replacing the example compound (C-12) with the compound (E-2). As a result, the open voltage was 0.88 V, the short-circuit current density was 4.35 mA/cm², the shape factor was 0.59, and the conversion efficiency was 2.25%. The conversion efficiency was lower than that in Example 32. Although the sensitizing dye (E-2) was used as a substitute for the co-adsorbent, no effect as the co-adsorbent was exerted, resulting in poor properties of the photoelectric conversion element.

Comparative Example 25

The procedure in Example 34 was repeated except for replacing the example compound (C-12) with the compound (E-2). As a result, the open voltage was 0.89 V, the short-circuit current density was 4.43 mA/cm², the shape factor was 0.58, and the conversion efficiency was 2.28%. The conversion efficiency was lower than that in Example 34. Although the sensitizing dye (E-2) was used as a substitute for the co-adsorbent, no effect as the co-adsorbent was exerted, resulting in poor properties of the photoelectric conversion element.

Example 36 and Reference Example 1

On the FTO glass substrate of the photoelectric conversion element prepared in Example 9, a UV blocking film (UV50 available from NIHON RIKA SEISHI CO., LTD.) having a total light transmittance of 90% and a rate of blocking ultraviolet light having a wavelength of 385 nm or less of 99% was bonded in the manner as illustrated in FIG. 3, to form an absorption wavelength control layer 12. The properties of this photoelectric conversion element under a white LED (200 lux) were evaluated and the results were compared with those of Example 9. The photoelectric conversion element was thereafter continuously irradiated with pseudo sunlight emitted from a solar simulator (AM1.5, 100 mW/cm²) from the working electrode side for 150 hours, and the properties under the white LED (200 lux) were evaluated again with or without the UV blocking film.

As a result, with the UV blocking film (Example 36), the output decrease rate was −1.76%, which is good, even after continuous irradiation with pseudo sunlight for 150 hours. On the other hand, without the UV blocking film (Reference Example 1), the output decrease rate was −68.82% after continuous irradiation with pseudo sunlight for 150 hours. It is clear from the above results that the UV blocking film is effective for maintaining the properties under the white LED (200 lux).

TABLE 8

| | UV blocking film | Initial/Temporal | Open Voltage (V) | Short-circuit Current Density (mA/cm²) | Shape Factor | Output Power (μW/cm²) |
|---|---|---|---|---|---|---|
| Example 36 | With | Initial | 0.83 | 16.02 | 0.77 | 10.23 |
| | | After Irradiation with Pseudo Sunlight for 150 h | 0.83 | 15.94 | 0.76 | 10.05 |
| Comparative Example 26 | Without | Initial | 0.84 | 15.99 | 0.76 | 10.2 |
| | | After Irradiation with Pseudo Sunlight for 150 h | 0.81 | 6.23 | 0.63 | 3.18 |

Example 37

The frame structure illustrated in FIG. 4 was formed for the photoelectric conversion element prepared in Example 36. Specifically, the photoelectric conversion element prepared in Example 36 was sealed by the cover glass 22 with an acrylic curable resin (TB-3035B available from Three-Bond Co., Ltd.) serving as the sealing resin 24. The extraction electrode 23 was also formed and sealed. The frame structure was formed with the polycarbonate resin 27, the carbon rubber 25, and the metal pin 26 for the sealed photoelectric conversion element. The properties of this photoelectric conversion element under a white LED (500 lux) were evaluated. Specifically, the frame structure was formed by welding upper and lower casings each comprising the polycarbonate resin by an ultrasonic welding instrument (2000×dt available from Branson Ultrasonics). The welding conditions were as follows: the collapse was 0.15 mm, the amplitude was 40%, the cylinder pressure was 200 kPa, and the trigger pressure was 22N.

As a result, the open voltage was 0.85 V, the short-circuit current density was 41.3 μA/cm², the shape factor was 0.76, and the output power was 26.68 μW/cm².

Example 38

The procedure in Example 1 was repeated except for replacing the titanium oxide (P-25 available from Nippon Aerosil Co., Ltd.) with a zinc oxide (available from C. I. Kasei Company, Limited). As a result, the open voltage was 0.80 V, the short-circuit current density was 5.40 mA/cm², the shape factor was 0.63, and the conversion efficiency was 2.72%. These properties are good, although they do not reach the level of those of Example 1 using the titanium oxide.

Example 39

The procedure in Example 1 was repeated except for replacing the titanium oxide (P-25 available from Nippon Aerosil Co., Ltd.) with a tin oxide (available from C. I. Kasei Company, Limited). As a result, the open voltage was 0.77 V, the short-circuit current density was 5.90 mA/cm², the shape factor was 0.66, and the conversion efficiency was 3.00%. These properties are good, although they do not reach the level of those of Example 1 using the titanium oxide.

It is clear from the above results that the combination of sensitizing dye and co-adsorbent in accordance with some embodiments of the present invention provide good conversion efficiency and high durability. It is also clear from the above results that the combination of sensitizing dye and co-adsorbent in accordance with some embodiments of the present invention can be easily detected by HPLC and the solution thereof can be easily managed.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

The invention claimed is:

1. A photoelectric conversion element comprising:
a first electrode;
an electron transport layer on the first electrode, the electron transport layer comprising an electron transport compound, the electron transport compound carrying:
a compound represented by the following formula (1):

Formula (1)

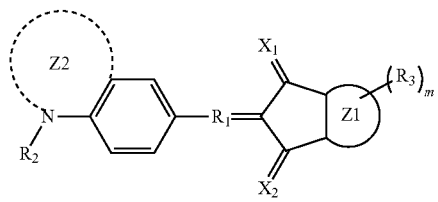

where each of $X_1$ and $X_2$ independently represents oxygen atom, sulfur atom, or selenium atom; $R_1$ represents methine group; $R_2$ represents an alkyl group, an aryl group, or a heterocyclic group; each of $R_3$ independently represents an acidic group; m represents an integer of 1 or 2; and each of $Z_1$ and $Z_2$ independently represents a group forming a cyclic structure; and a compound represented by the following formula (2):

$$R_5—R_4—COOH \qquad \text{Formula (2)}$$

where $R_4$ represents an aryl group or a heterocyclic group; and $R_5$ represents an alkyl group, an alkoxy group, an alkenyl group, an alkylthio group, or an aryl ether group;

a charge transfer layer; and
a second electrode; and wherein the compound represented by the formula (1) is represented by the following formula (4):

Formula (4)

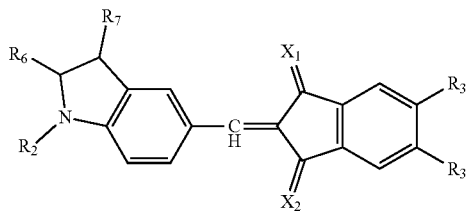

where each of X1 and X2 independently represents oxygen atom or sulfur atom; R2 represents an alkyl group, an aryl group, or a heterocyclic group; each of R3 independently represents an acidic group; and each of R6 and R7 independently represents an alkyl group, an aryl group, or a non-cyclic structure, or R6 and R7 share bond connectivity to form a cyclic structure.

2. The photoelectric conversion element of claim 1, wherein the compound represented by the formula (2) is represented by the following formula (5):

Formula (5)

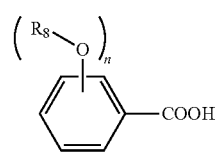

where $R_8$ represents an alkyl group, an alkenyl group, or an aryl group; and n represents an integer of from 1 to 3.

3. The photoelectric conversion element of claim 1, further comprising a blocking layer between the first electrode and the electron transport layer.

4. The photoelectric conversion element of claim 1, wherein the electron transport compound comprises an oxide semiconductor.

5. The photoelectric conversion element of claim 4, wherein the oxide semiconductor comprises at least one selected from the group consisting of titanium oxide, zinc oxide, tin oxide, and niobium oxide.

6. The photoelectric conversion element of claim 1, wherein the charge transfer layer comprises an organic hole transport material or an inorganic hole transport material.

7. The photoelectric conversion element of claim 6, wherein the organic hole transport material comprises a compound represented by the following formula (6):

Formula (6)

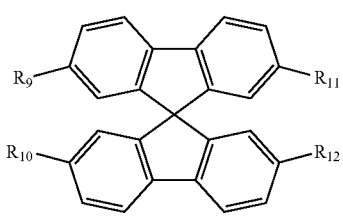

where each of $R_9$ to $R_{12}$ independently represents an amino group.

8. The photoelectric conversion element of claim 1, further comprising an absorption wavelength control layer on one side of the first electrode opposite to the electron transport layer, the absorption wavelength control layer exhibiting a total light transmittance of 90% or more and a rate of blocking ultraviolet light having a wavelength of 385 nm or less of 99% or more.

9. A solar cell comprising the photoelectric conversion element of claim 1.

* * * * *